(12) United States Patent
Takashima

(10) Patent No.: US 7,245,517 B2
(45) Date of Patent: Jul. 17, 2007

(54) FERROELECTRIC RANDOM ACCESS MEMORY

(75) Inventor: Daisaburo Takashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 75 days.

(21) Appl. No.: 11/220,853

(22) Filed: Sep. 8, 2005

(65) Prior Publication Data
US 2007/0008765 A1   Jan. 11, 2007

(30) Foreign Application Priority Data
Jul. 7, 2005   (JP) .............................. 2005-198968

(51) Int. Cl.
*G11C 11/22*   (2006.01)
(52) U.S. Cl. .................. 365/145; 365/230.03
(58) Field of Classification Search ................ 365/145, 365/230.03, 149
See application file for complete search history.

(56) References Cited

U.S. PATENT DOCUMENTS

| | | | |
|---|---|---|---|
| 5,903,492 A | | 5/1999 | Takashima |
| 6,094,370 A | * | 7/2000 | Takashima ................ 365/145 |
| 6,493,251 B2 | * | 12/2002 | Hoya et al. ................ 365/145 |
| 6,924,997 B2 | * | 8/2005 | Chen et al. ................ 365/145 |
| 6,950,361 B2 | * | 9/2005 | Kamoshida et al. ........ 365/203 |

FOREIGN PATENT DOCUMENTS

| JP | 10-255483 | 9/1998 |
|---|---|---|
| JP | 11-177036 | 7/1999 |
| JP | 2000-22010 | 1/2000 |

OTHER PUBLICATIONS

Hideto Hidaka, et al., "Twisted Bit-Line Architectures for Multi-Megabit DRAM's", IEEE Journal of Solid-State Circuits, vol. 24, No. 1, Feb. 1989, pp. 21-27.
Hiroshige Hirano, et al., "2-V/100-ns 1T/1C Nonvolatile Ferroelectric Memory Architecture with Bitline-Driven Read Scheme and Nonrelaxation Reference Cell", IEEE Journal of Solid-State Circuits, vol. 32, No. 5, May 1997, pp. 649-654.

* cited by examiner

*Primary Examiner*—Anh Phung
(74) *Attorney, Agent, or Firm*—Oblon, Spivak, McClelland, Maier & Neustadt, P.C.

(57) ABSTRACT

Four memory cells each obtained by connecting a ferroelectric capacitor in parallel to a transistor are connected in series with each other to constitute a cell block. A sense amplifier circuit is arranged on a one-end side in a column direction every four cell blocks sequentially adjacent to each other in a row direction. One ends of the four cell blocks are connected to four different plate lines, respectively, and the other ends of the four cell blocks are connected to four different bit lines through four block selection transistors, respectively. Of the four bit lines, two bit lines constitute a first bit line pair, and the two remaining bit lines constitute a second bit line pair. Any one of the first and second bit line pairs is connected to the sense amplifier circuit and the other bit line pair is connected at a constant voltage.

10 Claims, 23 Drawing Sheets

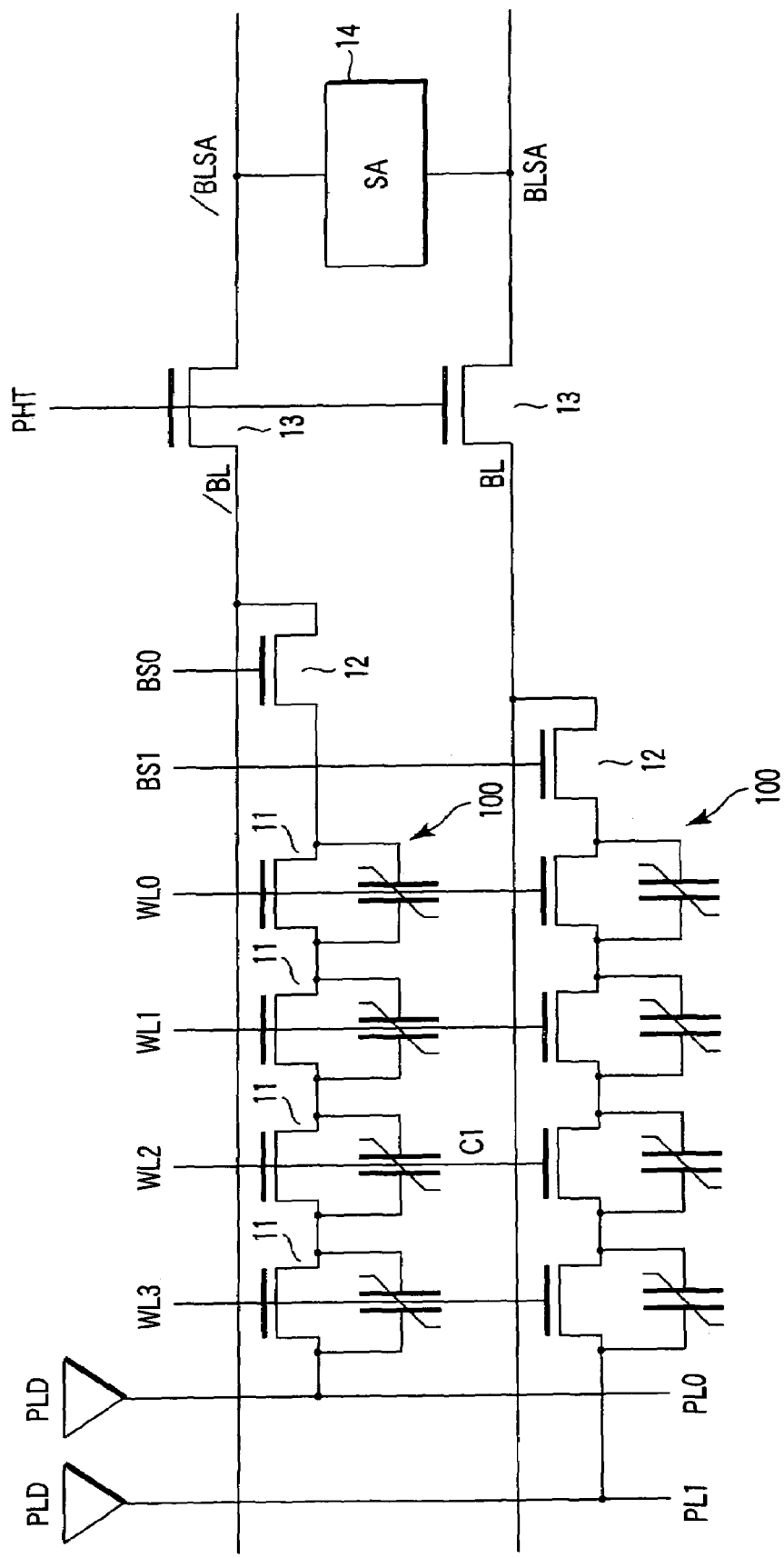
F I G. 1

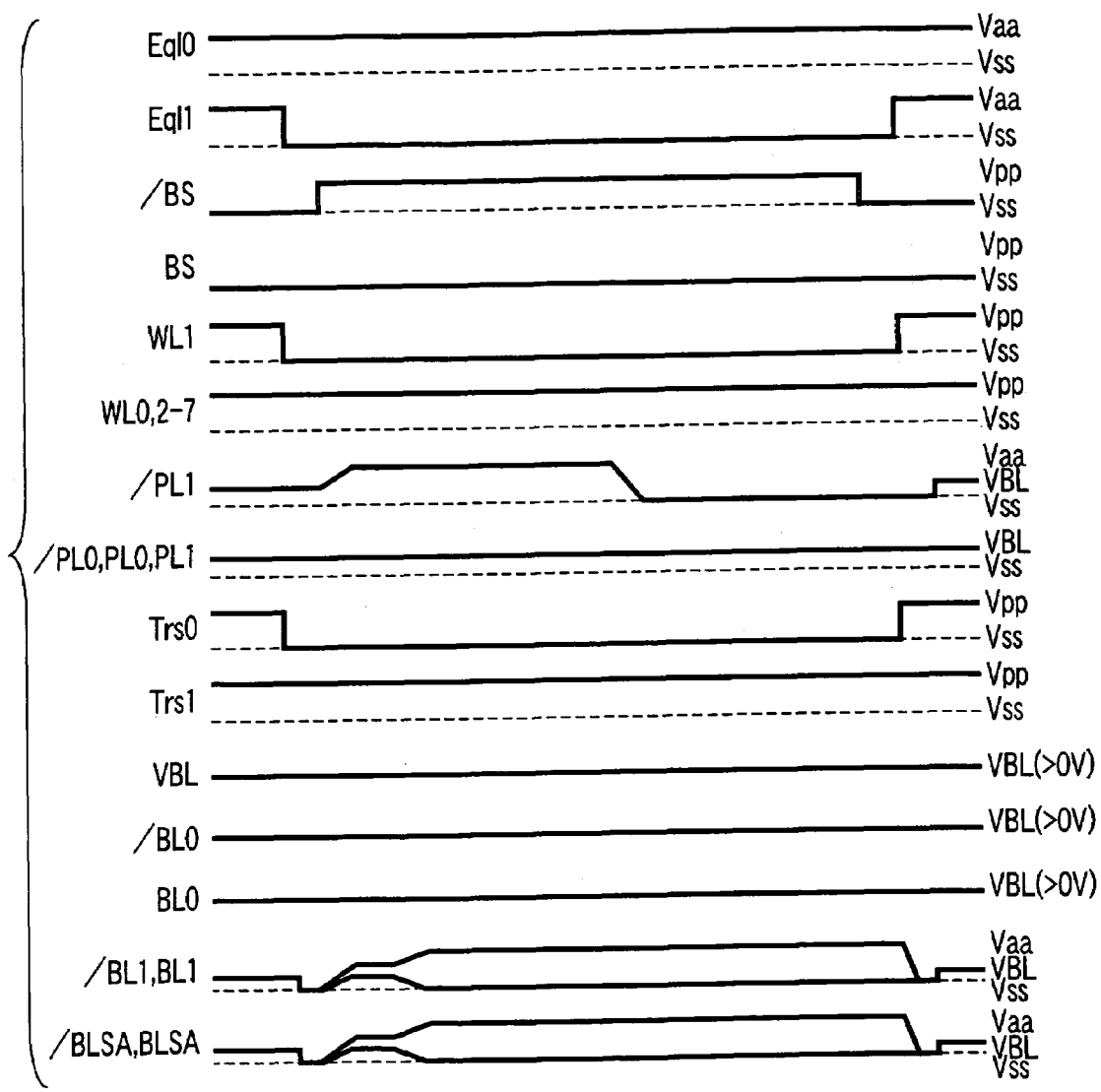
F I G. 14

FERROELECTRIC RANDOM ACCESS MEMORY

CROSS-REFERENCE TO RELATED APPLICATIONS

This application is based upon and claims the benefit of priority from prior Japanese Patent Application No. 2005-198968, filed Jul. 7, 2005, the entire contents of which are incorporated herein by reference.

BACKGROUND OF THE INVENTION

1. Field of the Invention

The present invention relates to a nonvolatile semiconductor memory device and, in particularly to, a ferroelectric random access memory. The present invention is used in a mobile product such as a cellular mobile telephone, a wireless tag, an IC card, a game machine, and the like.

2. Description of the Related Art

As a ferroelectric random access memory (FeRAM) using a ferroelectric capacitor, the present inventor proposes a scheme of a chain structure in Jpn. Pat. Appln. KOKAI Publication Nos. 10-255483, 11-177036, and 2000-22010. In the ferroelectric random access memory, a cell transistor and a ferroelectric capacitor are connected in parallel to each other to constitute one memory cell. In the ferroelectric random access memory using this scheme, a memory cell having a small size, a planar transistor which can be easily manufactured, a versatile high-speed random access function, and the like can be realized.

A ferroelectric random access memory having a folded bit line configuration is known. In this ferroelectric random access memory, array noise caused by on from the word lines, the plate lines, the substrate, and the like can be reduced. However, noise caused by a parasitic capacity between bit lines in different bit line pairs cannot be reduced.

As a scheme which can be applied to reduce noise caused by the parasitic capacitor between bit lines in a ferroelectric random access memory, a scheme described in H. Hidaka et al., IEEE Journal of Solid-State Circuit, Vol. 24, No. 1, pp. 21–27, February 1989 or H. Hirano et al., IEEE Journal of Solid-State Circuit, Vol. 32, No. 5, May. 1997 are known. In H. Hidaka et al., noise is reduced by twisting bit lines in the folded bit line configuration. In this scheme, however, since a twist region is secured, a chip size increases by about several percentages, and an effect of reducing a power consumption cannot be achieved.

In H. Hirano et al., only a selected column (bit line pair) in the memory cell array is activated. In this scheme, a power consumption of the memory cell array can be suppressed. Since cell data is not read from unselected bit line pairs located both the sides of the selected bit line pair, the unselected bit line pairs can be used for a shielding purpose. As a result, noise caused by a parasitic capacity between bit lines can be reduced. However, as a first problem, some sense amplifier circuits are activated, and the remaining sense amplifier circuits are inactivated. For this reason, decode circuits achieved by column addresses are required for all the sense amplifier circuits to increase the number of elements. As a second problem, although a low power consumption can be realized, column addresses must be decoded, and therefore, date except for limited data cannot be read or written outside the chip, and a bandwidth is limited. As a third problem, memory cells of columns except for a selected column must be inactivated, a plate drive circuit and plate lines must be arranged on the same side as that of a sense amplifier circuit to complicate the circuit. As a fourth problem, since a plate line connected to a memory cell at a row address except for a selected row address is inactivated, an unselected memory cell is disadvantageously disturbed.

The present inventor has proposed a method of reducing noise from a selected bit line pair and a sense amplifier circuit connected thereto, and a unselected bit line pair and a sense amplifier circuit connected thereto in a configuration obtained by alternately arranging bit line pairs and sense amplifier circuits connected thereto (U.S. Patent application. No. 2004/0105293).

In the ferroelectric random access memory having a chain structure, it is assumed that word lines and plate lines are arranged in a direction perpendicular to bit lines, that data of only one bit line is read every four bit lines, and that data of the other bit lines are not read. In this case, in general idea, memory cells of four types are necessary. In addition, four plate lines and four word lines are arranged on one memory cell, and each one plate line and word line must be activated every four plate lines and four word lines to considerably increase a cell size.

BRIEF SUMMARY OF THE INVENTION

According to one aspect of the present-invention, there is provided a ferroelectric random access memory comprising: a memory cell array in which a plurality of memory cell blocks each obtained by series-connecting a plurality of memory cells each constituted by a cell transistor having source and drain terminals and a ferroelectric capacitor connected in parallel between the source and drain terminals of the cell transistor are arranged in the form of a matrix, a block group being constituted by first to fourth memory cell blocks sequentially adjacently arranged in a row direction; a plurality of word lines arranged to extend in the row direction of the memory cell array; a plurality of bit lines arranged to extend in a column direction of the memory cell array and including first to fourth bit lines, the first bit line and the third bit line constituting a first bit line pair, and the second bit line and the fourth bit line constituting a second bit line pair; a plurality of plate lines arranged to extend in the row direction of the memory cell array and including first to fourth plate lines to which one ends of the first to fourth memory cell blocks are connected, respectively; a plurality of sense amplifier circuits arranged on a one-end side of the memory cell array in the column direction every block group constituted by the first to fourth memory cell blocks; first to fourth block selection transistors connected between the other ends of the first to fourth memory cell blocks and the first to fourth bit lines, respectively; a first block selection signal line arranged to extend in the row direction of the memory cell array and commonly connected to gate electrodes of the first and second block selection transistors; and a second block selection signal line arranged to extend in the row direction of the memory cell array and commonly connected to gate electrodes of the third and fourth block selection transistors.

BRIEF DESCRIPTION OF THE SEVERAL VIEWS OF THE DRAWING

FIG. 1 is a circuit diagram of a ferroelectric random access memory according to a comparative example;

FIG. 14 is a waveform chart showing an operation of a ferroelectric random access memory according to a second modification of the first embodiment;

DETAILED DESCRIPTION OF THE INVENTION

Figure 2:
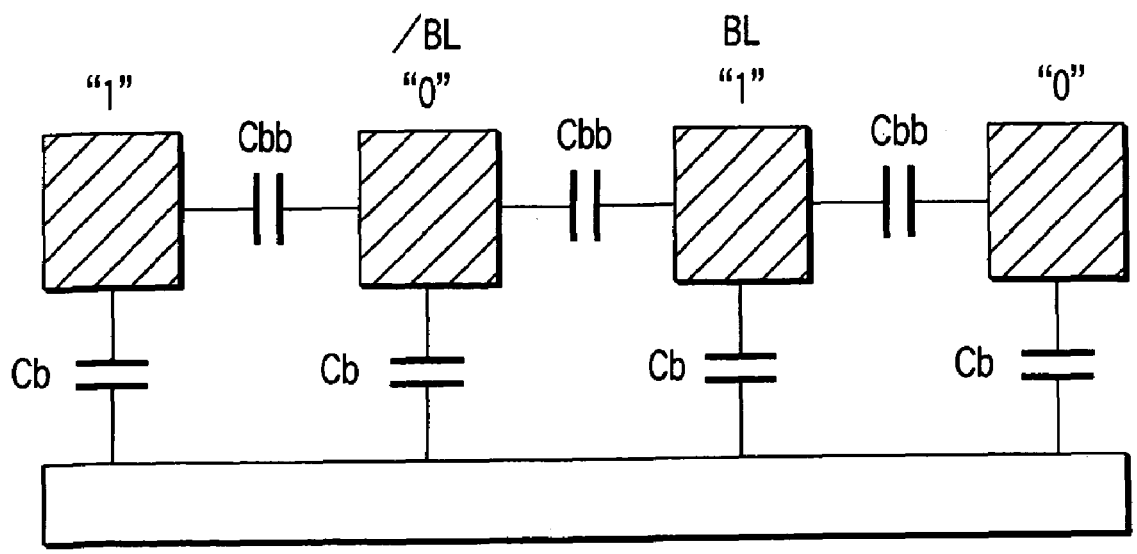
FIG. 2 is a sectional view of a memory cell array section of the ferroelectric random access memory in FIG. 1.

A comparative example will be described below prior to an explanation of embodiments of the present invention.

FIG. 1 is a circuit diagram of a ferroelectric random access memory according to a comparative example. One memory cell 11 is constituted by a transistor (to be referred to as a cell transistor hereinafter) and a ferroelectric capacitor which are connected in parallel to each other. A plurality of memory cells each obtained by the parallel connection, for example, four memory cells are connected in series with each other to constitute one memory cell block 100. Furthermore, a plurality of memory cell blocks 100 constitute a memory cell array. Gate electrodes of the cell transistors corresponding to the plurality of memory cell blocks 100 are commonly connected to a word line, in the example, any one of four word lines WL0 to WL3. In each column of the memory cell array, one end of the memory cell block 100 is connected to any one bit line of a bit line pair /BL and BL through a block selection transistor 12, and the other end of the memory cell block 100 is connected to a plate line, i.e., any one of plate lines PL0 and PL1 in FIG. 1. The block selection transistor 12 is switchably controlled by a block selection signal line, i.e., any one of block selection signal lines BS0 and BS1 in FIG. 1. The bit line pair /BL and BL is connected to the sense amplifier circuit (SA) 14 through a pair of column selection transistors 13. The memory cell blocks 100 are arranged on both the sides of the sense amplifier circuit 14. However, the memory cell block 100 arranged on one side is omitted in FIG. 1.

An operation of the circuit shown in FIG. 1 will be briefly described below. In a Stand-by state, all the word lines WL0 to WL3 are driven to a High level to turn on the cell transistors, and the block selection signal lines BS0 and BS1 are driven to a Low level to turn off the block selection transistors 12. In this manner, since both the ends of the ferroelectric capacitor are electrically short-circuited by the ON cell transistors, a voltage difference is not generated between both the ends, and memory polarization is stably held. In an activate state, only cell transistors connected in parallel to a ferroelectric capacitor from which data is desirably read is turned off, and a desired block selection transistor is turned on.

For example, when a ferroelectric capacitor C1 in FIG. 1 is selected, a word line WL2 is driven to Low. Thereafter, the plate line PL0 is driven to High, and the block selection signal line BS0 is driven to High, so that a voltage difference between the plate line PL0 and the bit line /BL is applied to only both the ends of the ferroelectric capacitor C1 connected in parallel to an OFF selected cell transistor. Polarization information of the ferroelectric capacitor C1 is read on the bit line /BL.

As shown in FIG. 1, the block selection signals of two types are introduced to drive only one of the two block selection signal lines BS0 and BS1 to High, and the cell data is read on one bit line of the bit line pair. At this time, the other bit line of the bit line pair is used as reference bit lines. In this manner, a folded bit line configuration can be obtained. In a folded bit line configuration, when the bit line pair is arranged in the same memory cell array, and when noise generated in the other memory cell array is on both the bit lines and the reference bit lines, the noise can be canceled by the sense amplifier circuit 14 which amplifies the voltage difference between the bit lines. With the folded bit line configuration, noise inherent in an open bit line configuration, for example, noise generated by the word lines arranged in a direction perpendicular to the bit lines, the plate lines, the substrate, and the like can be suppressed from acting as noise on the bit lines.

According to the configuration as shown in FIG. 1, a minimum size of a memory cell can be realized in 4 $F^2$ (F is a wiring width and an inter-wiring space) by using planar transistors. Even though a plurality of memory cells are connected in series with each other, an arbitrary word line is selected to make it possible to read cell data of an arbitrary ferroelectric capacitor, and perfect random access can be realized. Since a plate line can be shared by a plurality of memory cells, the area of a plate line drive circuit can be increased while reducing a chip size, and a high-speed operation can be realized. Furthermore, the number of bit line contacts for connecting the bit lines and the memory cell blocks is changed from the number in cell unit to the number in block unit. In this manner, a bit line capacitance per memory cell can be reduced, an occupied area of sense amplifier circuits can be reduced, and the bit line capacitance can be reduced. For this reason, a large read signal can be obtained.

Figure 3:
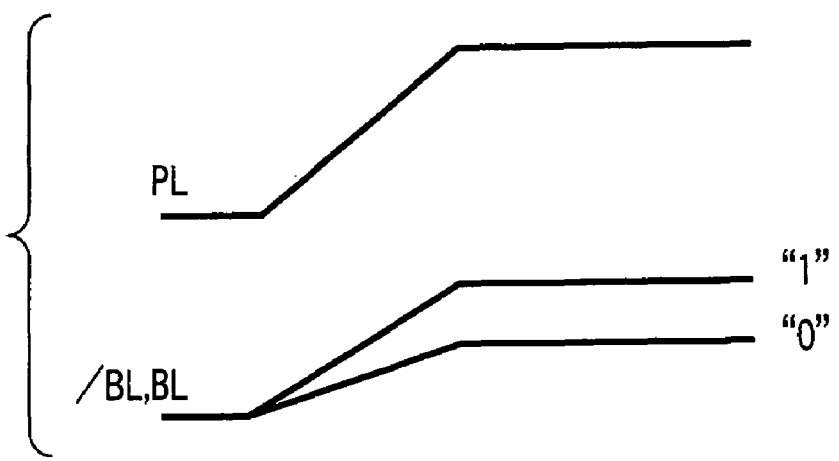
FIG. 3 is a waveform chart showing a drive voltage of a plate line in the ferroelectric random access memory in FIG. 1 and an example of a change in voltage of a bit line pair.

FIG. 2 shows a sectional structure obtained by cutting the memory cell array in FIG. 1 along a direction perpendicular to the bit lines. FIG. 3 shows a drive voltage of the plate line PL in a data read state in a so-called 2 T2 C operation for reading/writing data by using, e.g., two memory cells and changes in voltage of the bit line pair /BL and BL. In FIG. 2, when parasitic capacitances of the bit lines /BL and BL and a parasitic capacitance between the bit lines are represented by Cb and Cbb, respectively, interference noise between the bit lines increases as a value of Cbb/Cb increases. In this case, in a memory cell of a cross point type arranged at a cross point between the word line and the bit line, a distance between the bit lines increases. For this reason, noise is reduced by the increase in distance. However, when the distance between the bit lines is shortened by scaling, the noise becomes serious. In particular, in the ferroelectric random access memory, as shown in the waveform shown in FIG. 3, when the plate line PL is driven to read memory cell data, bit line voltages in not only an operation for reading "1" data but also an operation for reading "0" data increase, all the bit lines have offsets by the influence of Cbb. For example, when "0" data and "1" data are read on the bit line /BL and BL, respectively, an influence of noise becomes worst in the case where the left and right bit lines /BL and BL read the "1" data and "0" data, respectively. The bit line pair /BL and BL have opposite data, and thus, when original read signals are given by ±Vsig, noise received by the bit line /BL is given by 2 Cbb/CBVsig, and noise received by the bit line BL is given by 2 Cbb/CbVsig. In the 2 T2 C operation, a sum of noise is given by 4 Cbb/CbVsig, an original signal is given by 2 Vsig, and an N/S ratio is 2 Cbb/Cb. In a so-called 1 T1 C operation which reads/writes data by using one memory cell, a reference bit line is set every two bit lines, a sum of noise is given by 2 Cbb/CbVsig, an original signal is given by 1 Vsig, and an N/S ratio is 2 Cbb/Cb.

Embodiments of the present invention will be explained below with reference to the accompanying drawings. In the explanation of the following embodiments, the same reference numerals as in all the drawings denote the same parts in the drawings, and an overlapping description is omitted.

First Embodiment

Figure 4:
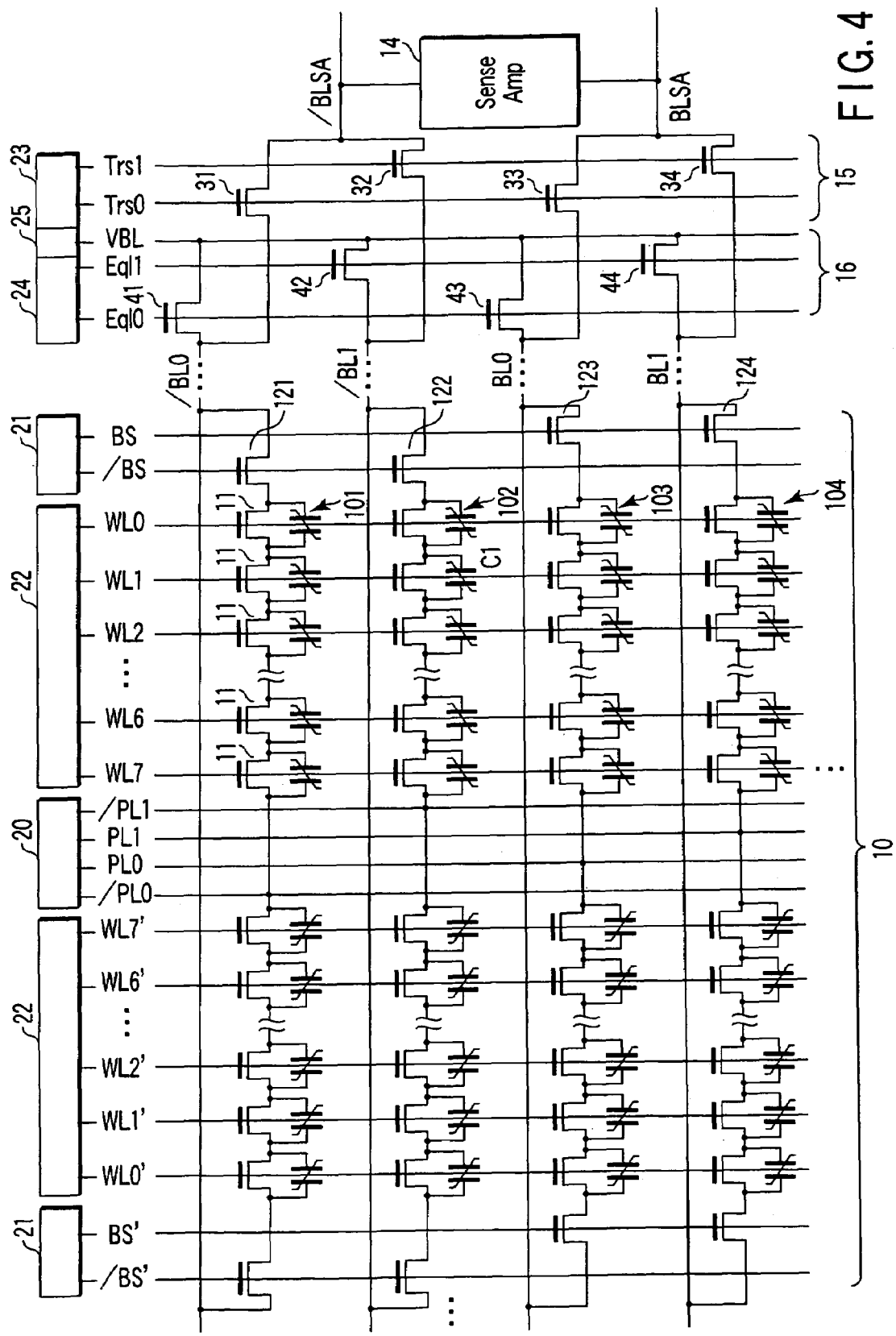
FIG. 4 is a circuit diagram of a ferroelectric random access memory according to a first embodiment.

FIG. 4 is a circuit diagram of a ferroelectric random access memory according to a first embodiment of the present invention.

In the ferroelectric random access memory in FIG. 4, each memory cell has the same configuration as that in the ferroelectric random access memory according to the comparative example shown in FIG. 1. However, the ferroelectric random access memory in FIG. 4 is different from that of the comparative example in that one memory cell block is constituted by eight memory cells 11 and in the following points.

(a) One block group is constituted by four memory cell blocks consisting of a first memory block 101, a second memory cell block 102, a third memory cell block 103, and a fourth memory cell block 104 which are sequentially adjacently arranged in a row direction of a memory cell array 10.

(b) One ends of the first to fourth memory cell blocks 101 to 104 are connected to the first to fourth plate lines /PL0, /PL1, P10, and PL1, respectively. These first to fourth plate lines /PL0, /PL1, PL0, and PL1 are driven by a plate line drive circuit 20.

(c) The other ends of the first to fourth memory cell blocks 101 to 104 are connected to first to fourth bit lines /BL0, /BL1, BL0, and BL1 through first to fourth block selection transistors 121 to 124, respectively. A sense amplifier circuit (Sense Amp) 14 is arranged on an one-end side of the memory cell array 10 in the column direction every block group constituted by the first to fourth memory cell blocks 101 to 104. First to fourth block selection transistors 121 to 124 are provided. The gate electrodes of the first block selection transistor 121 and the second block selection transistor 122 are commonly connected to the first block selection signal line /BS. The gate electrodes of the third block selection transistor 123 and the fourth block selection transistor 124 are commonly connected to the second block selection signal line BS different from the first block selection signal line. The first and second block selection signal lines /BS and BS are driven by a block selection signal drive circuit 21.

(d) The first bit line /BL0 and the third bit line BL0 constitute a first bit line pair, and the second bit line /BL1 and the fourth bit line BL1 constitute a second bit line pair. Between the memory cell array 10 and the sense amplifier circuit 14, in a sense operation, circuits 15 and 16 to connect any one of the first bit line pair and the second bit line pair to the sense amplifier circuit 14 and keep the voltage of the other at a constant voltage are formed. The circuits will be described later.

Although the memory cell blocks are arranged on both the sides of the sense amplifier circuit 14, the memory cell block on one side is omitted in FIG. 4.

The configuration of the ferroelectric random access memory in FIG. 4 will be described in detail. One memory cell 11 is constituted by a cell transistor and a ferroelectric capacitor connected in parallel between the source and drain terminals of the cell transistor. One memory cell block is constituted by a plurality of memory cells, in this embodiment, eight memory cells which are connected in series with each other. Such memory cell blocks are arranged in the form of a matrix to constitute the memory cell array 10. In this case, one block group is formed by four memory cell blocks, i.e., the first to fourth memory cell blocks 101 to 104 sequentially adjacently arranged in the row direction.

A plurality of word lines are arranged to extend in the row direction of the memory cell array. The plurality of word lines include the seven word lines WL0 to WL7 and WL0' to WL7', respectively. The plurality of word lines are driven by a word line drive circuit 22.

A plurality of bit lines including first to fourth bit lines /BL0, /BL1, BL0, and BL1 which are sequentially adjacently arranged in the row direction are arranged to extend in a column direction. First to fourth plate lines /PL0, /PL1, PL0, and PL1 are arranged to extend in the row direction of the memory cell array. One ends of the first to fourth memory cell blocks 101 to 104 are connected to the first to fourth plate lines /PL0, /PL1, PL0, and PL1, respectively.

The first to fourth block selection transistors 121 to 124 are connected between the other ends of the first to fourth memory cell blocks 101 to 104 and the first to fourth bit lines /BL0, /BL1, BL0, and BL1, respectively. First and second block selection signal lines are arranged to extend in the row direction of the memory cell array. The first block selection signal line /BS is commonly connected to the gate electrodes of the first and second block selection transistors 121 and 122, and the second block selection signal line BS is commonly connected to the gate electrodes of the third and fourth block selection transistors 123 and 124.

The sense amplifier connection switch circuit 15 constituted by first to fourth sense amplifier connection switch transistors 31 to 34 is inserted between the first to fourth bit lines /BL0, /BL1, BL0, and BL1 and the sense amplifier circuit 14. First and second sense amplifier connection switch control lines Trs0 and Trs1 are arranged to extend in the row direction of the memory cell array. The first sense amplifier connection switch control line Trs0 is commonly connected to the gate electrodes of the first and third sense amplifier connection switch transistors 31 and 33, and the second sense amplifier connection switch control line Trs1 is commonly connected to the gate electrodes of the second and fourth sense amplifier connection switch transistors 32 and 34. The first and second sense amplifier connection switch control lines Trs0 and Trs1 are driven by a switch control line drive circuit 23.

The bit line voltage equalizing circuit 16 constituted by first to fourth bit line voltage equalizing switch transistors 41 to 44 is inserted between the first to fourth bit lines /BL0, /BL1, BL0, and BL1 and a bit line voltage supply line VBL. First and second equalization control lines Eq10 and Eq11 are arranged to extend in the row direction of the memory cell array. The first equalization control line Eq10 is commonly connected to the gate electrode of the first and third bit line voltage equalizing switch transistors 41 and 43, and the second equalization control line Eq11 is commonly connected to the gate electrodes of the second and fourth bit line voltage equalizing switch transistors 42 and 44. The first and second equalization control lines Eq10 and Eq11 are driven by an equalization control line drive circuit 24, and the bit line voltage supply line VBL is driven by a bit line drive circuit 25.

The sense amplifier connection switch circuit 15 and the bit line voltage equalizing circuit 16 select any one of the two bit lines /BL0 and /BL1 in a sense operation to connect the selected bit line to one bit line /BLSA of the sense amplifier circuit 14 and to connect the other unselected bit line to the bit line voltage supply line VBL. The sense amplifier connection switch circuit 15 and the bit line voltage equalizing circuit 16 select any one of the two bit lines BL0 and BL1 to connect the selected bit line to the other bit line BLSA of the sense amplifier circuit 14 and to connect the other unselected bit line to the bit line voltage supply line VBL set at a constant voltage. In other words, in the sense operation, any one of the first bit line pair and the second bit line pair is selected to be connected to the sense amplifier circuit 14, and the other unselected bit line pair can be kept at the constant voltage VBL.

An operation of the ferroelectric random access memory in FIG. 4 will be described below with reference to FIG. 5. This example shows a case in which memory data in the ferroelectric capacitor C1 selected in selection of the word line WL1 in the second memory cell block 102 in FIG. 4 is read/written.

In this operation, of the two bit line equalization signal lines Eq10 and Eq11, only the bit line equalization signal line Eq11 is driven to Low, one bit line pair /BL1 and BL1 is set in a floating state, and the other bit line pair /BL0 and BL0 is fixed to Vss (=VBL).

Almost simultaneously with the above operation, of the sense amplifier connection switch control lines Trs0 and Trs1, the sense amplifier connection switch control line Trs1 is driven to High, and the transistors 32 and 34 are turned on, so that the bit lines /BL1 and BL1 are connected to the sense amplifier circuit 14. On the other hand, the bit lines /BL1 and BL1 are disconnected from the sense amplifier circuit 14 by turning off the transistors 31 and 33. The transistors 41 and 43 are turned on to fix the bit lines /BL1 and BL1 to a voltage Vss. In this manner, the bit lines /BL1 and BL1 are connected to the sense amplifier circuit 14 as a bit line pair operated in a folded bit line configuration, and the bit lines /BL0 and BL0 are inserted between operating bit lines and function as shield bit lines which shield interference between the operating bit-lines.

Almost simultaneously with this operation, in order to turn off a cell transistor connected in parallel to the ferroelectric capacitor C1 in the second memory cell block 102, the word line WL1 is driven to Low. Furthermore, the block selection signal line /BS is driven to High to select the second memory cell block 102, and cell data is not read from the fourth memory cell block 104. More specifically, the block selection signal line BS is driven to Low not to select the fourth memory cell block 104.

Of the four plate lines, only the plate line /PL1 connected to the selected second memory cell block 102 is raised from Vss to a High level (Vaa). In this manner, a voltage difference between the plate line /PL1 and the bit line /BL1 is applied to the selected ferroelectric capacitor C1, and cell data is read on the bit line /BL and transferred to the bit line /BLSA of the sense amplifier circuit 14. At this time, since the block selection signal line BS is at Low, the block selection transistor 124 of the fourth memory cell block 104 is in an OFF state. Therefore, cell data is not read from the fourth memory cell block 104 onto the bit line BL1 serving as a reference bit line, and a folded bit line configuration can be realized by the bit lines /BL1 and BL1.

When a voltage having an intermediate value between "1" data and "0" data of the read bit line /BL1 is generated by a dummy cell circuit built in the sense amplifier circuit or the like, the 1 T1 C operation can be realized. At this time, in the fourth memory cell block 104, the cell transistors connected to the word line WL1 are turned off. However, the plate line /PL1 is kept at Vss, and the block selection signal line BS is at Low. For this reason, data breakdown does not occur. In addition, in the first memory cell block 101 connected to the shield bit line /BL0, the cell transistors connected to the word line WL1 are turned off. Since the plate line /PL0 is at Vss, and the block selection signal line /BS is at High, the first memory cell block 101 and the bit line /BL0 are connected to each other. However, the bit line /BL0 is fixed to the voltage Vss, and no voltage is applied to any memory, so that the memory block 101 is not adversely affected. In the third memory cell block 103 connected to the shield bit line BL0, the cell transistors connected to the word line WL1 are turned off. However, the plate line PL0 is at Vss, and the block selection signal line BS is at Low. For this reason, no voltage is applied to any memory cells, and the memory cell block is not adversely affected.

Thereafter, a voltage difference between the bit lines /BL1 and BL1 (between /BLSA and BLSA) is amplified by the sense amplifier circuit 14 and read out of the chip. At this time, the data outside the chip is written in the bit line pair /BL1 and BL1 (/BLSA and BLSA). When the plate line /PL1 is at High, the "0" data is written back in the memory cell if the voltage of the bit line /BL1 is at Low. Thereafter, when the plate line /PL1 goes to Low, the "1" data is written back in the memory cell if the voltage of the bit line /BL1 is at High. Thereafter, the block selection signal line /BS returns to Low, the word line WL1 returns to High, the bit line equalization control line Eq11 returns to High, and the sense amplifier connection switch control line Trs0 returns to High. At this time, a series of write operations are terminated.

As described above, memory cell data is read on any one of the bit lines /BL and BL1, and the other bit line is used as a reference bit line, so that a read operation according to the folded bit line scheme can be realized. In this manner, noise caused by array noise on from the word lines, the plate lines, the substrate, and the like in the memory cell array is reduced, the remaining bit lines /BL0 and BL0 are fixed to a constant voltage to function as shield bit lines, so that array noise caused by a parasitic capacity between the bit lines can be reduced. In contrast to the above description, when the bit lines /BL0 and BL0 are subjected to a read operation according to the folded bit line scheme, the remaining bit lines /BL1 and BL1 can be caused to function as shield bit lines.

With the above configuration, only one sense amplifier circuit 14 is required every four bit lines, the number of sense amplifier circuits 14 can be ½ the number of sense amplifier circuits used when one sense amplifier is arranged every two bit lines. Of the four bit lines, two bit lines function as shield bit lines. For this reason, a power consumption of the cell array in an operation can be reduced to ½ a power consumption of a cell array which does not use a shield bit line. In addition, various signal lines arranged in a direction perpendicular to the bit lines can be freely changed in position in units of memory cell blocks. For this reason, four plate lines are arranged on a memory cell to make it possible to prevent the size of the memory cell block from being increased.

More specifically, according to the configuration in FIG. 4, in comparison with a configuration in which one sense amplifier circuit is formed every two bit lines, both inter-bit-line noise and other array noise can be reduced without increasing the memory cell block size. Furthermore, the occupied area of sense amplifier circuits can be reduced by half, and the power consumption of the memory cell array in an operation can be reduced by half.

In this embodiment, in order to read cell data on one of four bit lines, four plate lines and two block selection signal lines are used. The reason why the memory cell array can be realized by the two block selection signal lines is that one block selection signal line is used to read cell data from at least one bit line and the other block selection signal line is used to separate a reference bit line which amplitude-operates from the memory cell block. The characteristic point of the embodiment is as follows. When the shield voltage of the other shield bit lines is set to be equal to the plate line voltage, the block selection transistor can be in any one of an ON state and an OFF state. For this reason, an excessive block selection signal is not necessary. Although the four plate lines are necessary in the embodiment, the plate lines can be arranged without increasing a cell block size (as will be described later with reference to FIGS. 6 to 12).

In this embodiment, the "1" and "0" data can also be written in two ferroelectric capacitors to make it possible to perform a 2 T2 C operation. In this case, in the operation, both the block selection signal lines /BS and BS are driven to High, both the plate lines /PL0 and PL0 are selected, or both the plate line /PL1 and bit line BL1 are selected, reverse data is read on the reference bit line. For this reason, a dummy cell circuit is not necessary.

Figure 6:
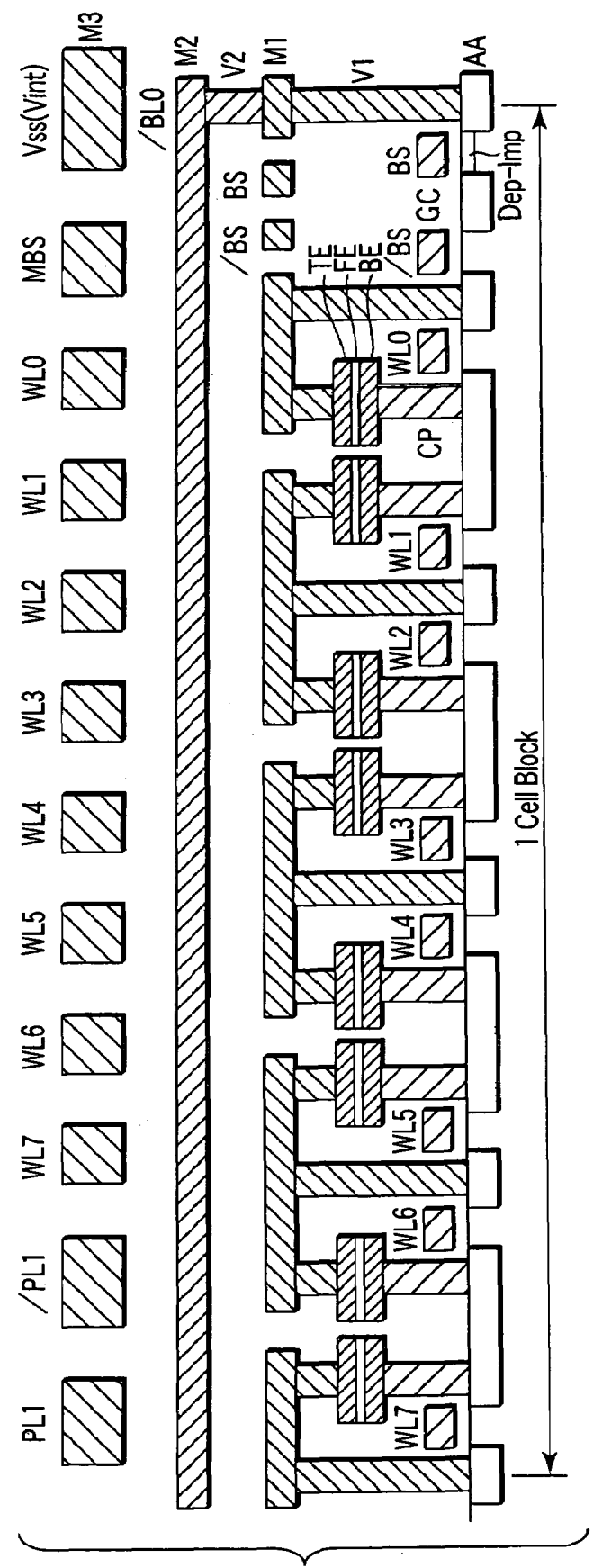
FIG. 6 is a sectional view showing the structure of a part of a memory cell array of the ferroelectric random access memory in FIG. 4.
Figure 7:
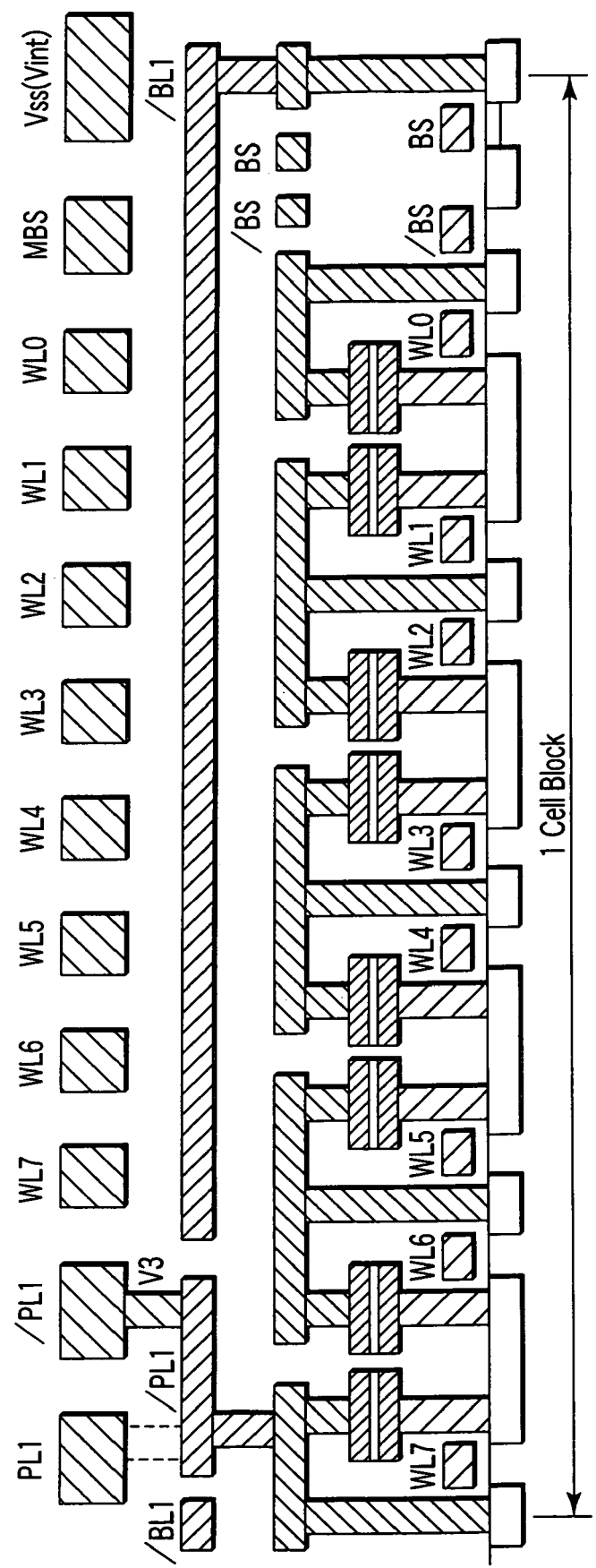
FIG. 7 is a sectional view showing the structure of another part of the memory cell array of the ferroelectric random access memory in FIG. 4.
Figure 8:
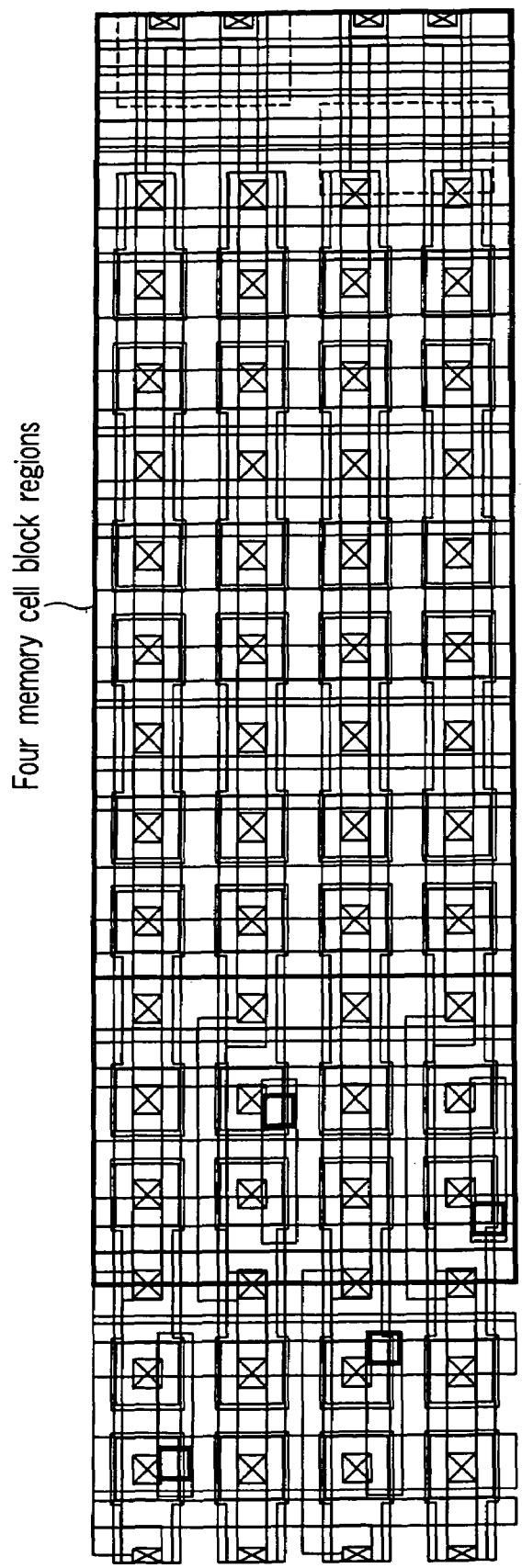
FIG. 8 is a multi-layered layout chart of the ferroelectric random access memory in FIG. 4.
Figure 9:
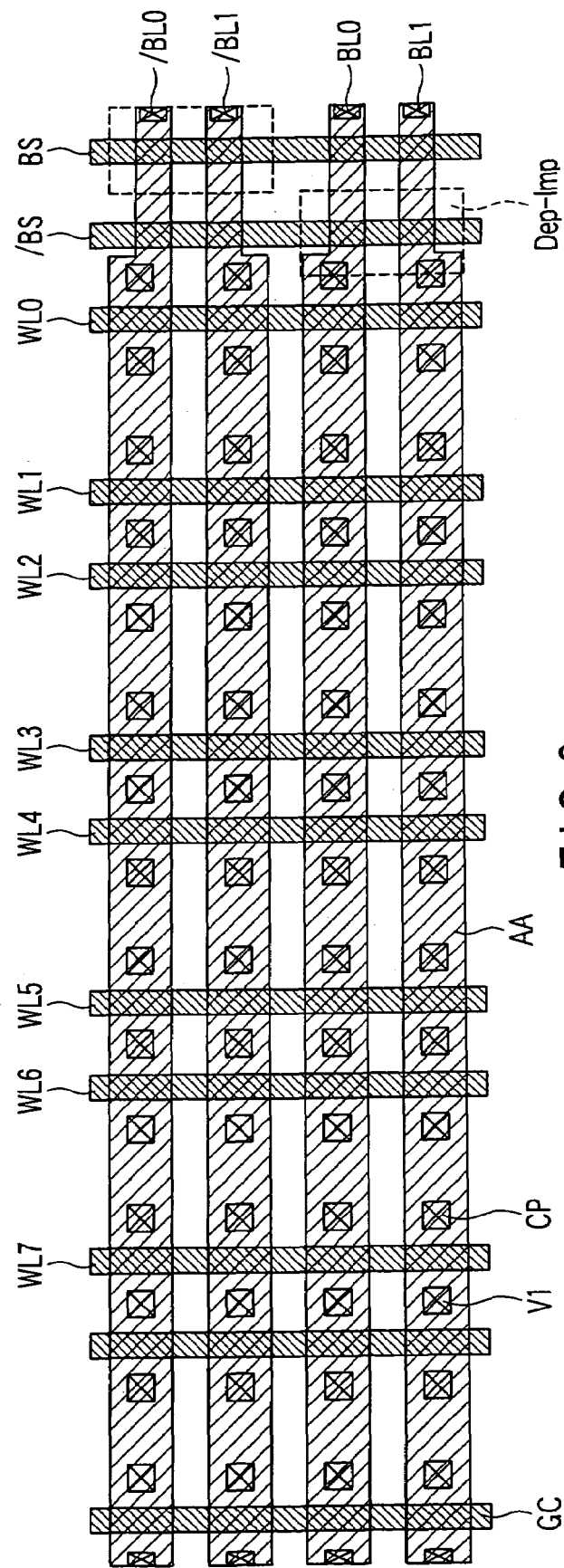
FIG. 9 is a layout chart obtained by extracting some layer from the layout chart in FIG. 8.
Figure 10:
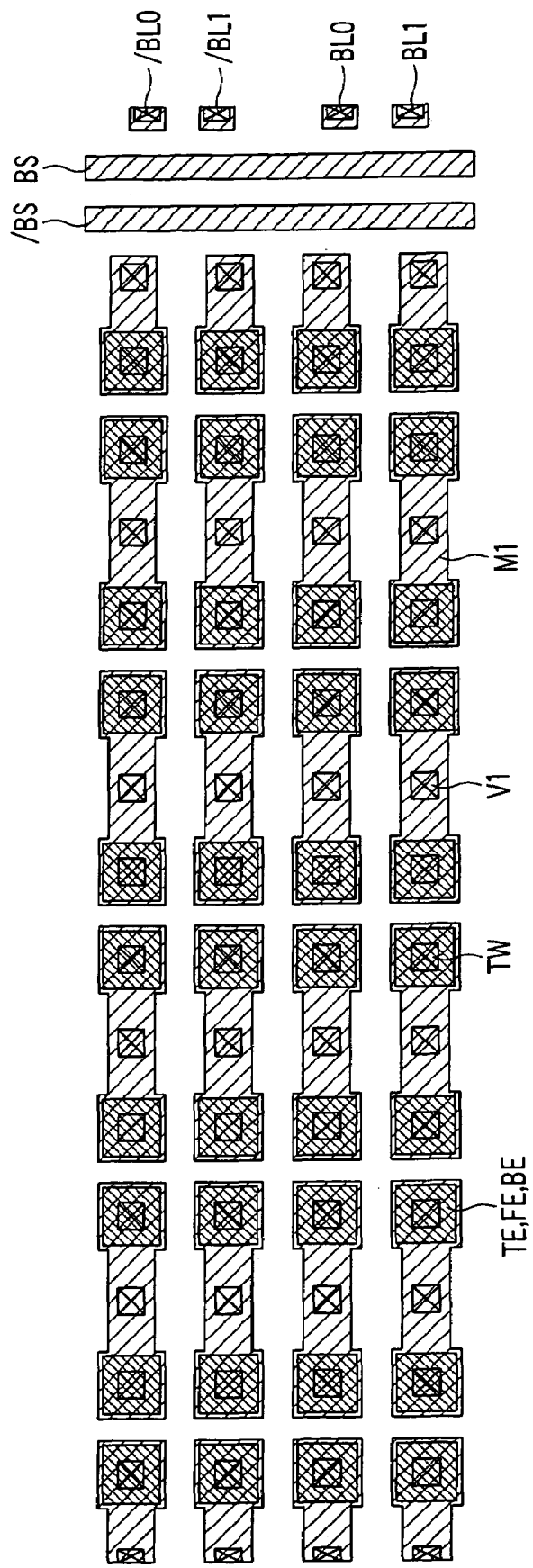
FIG. 10 is a layout chart obtained by extracting some layer from the layout chart in FIG. 8.
Figure 11:
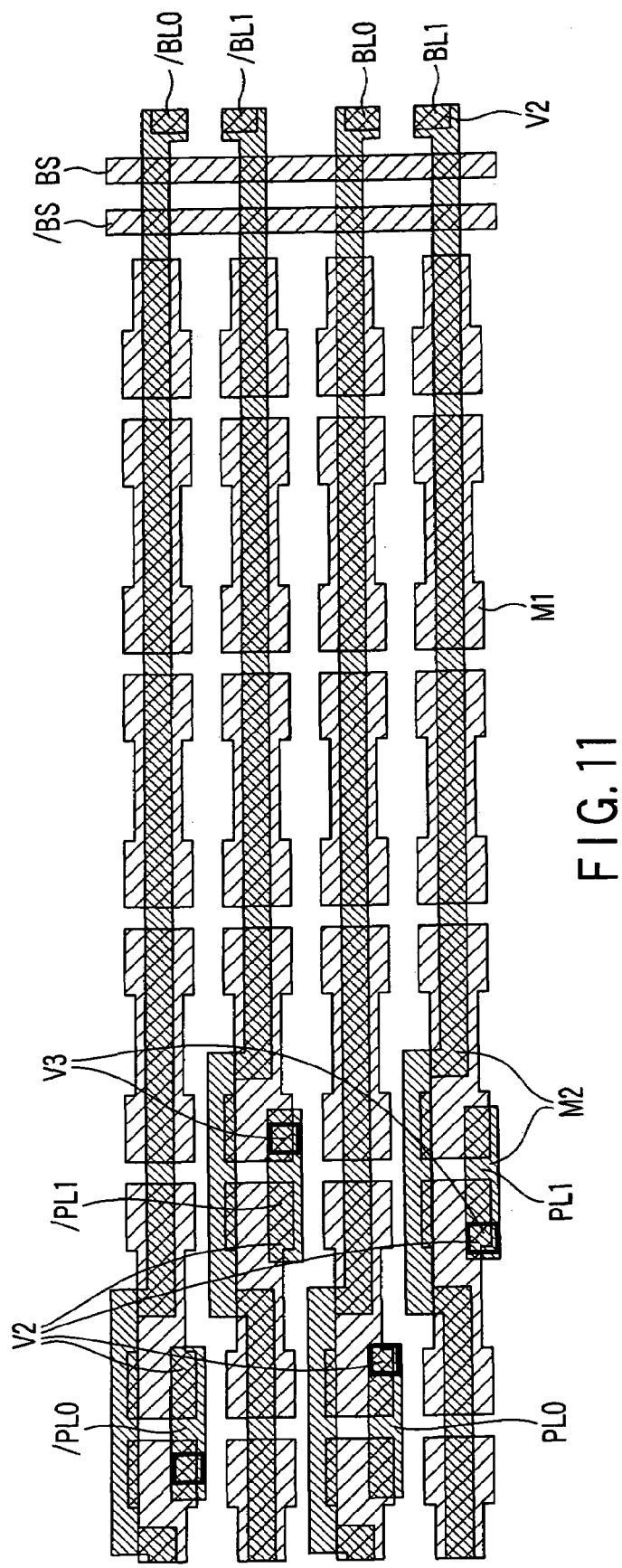
FIG. 11 is a layout chart obtained by extracting some layer from the layout chart in FIG. 8.
Figure 12:
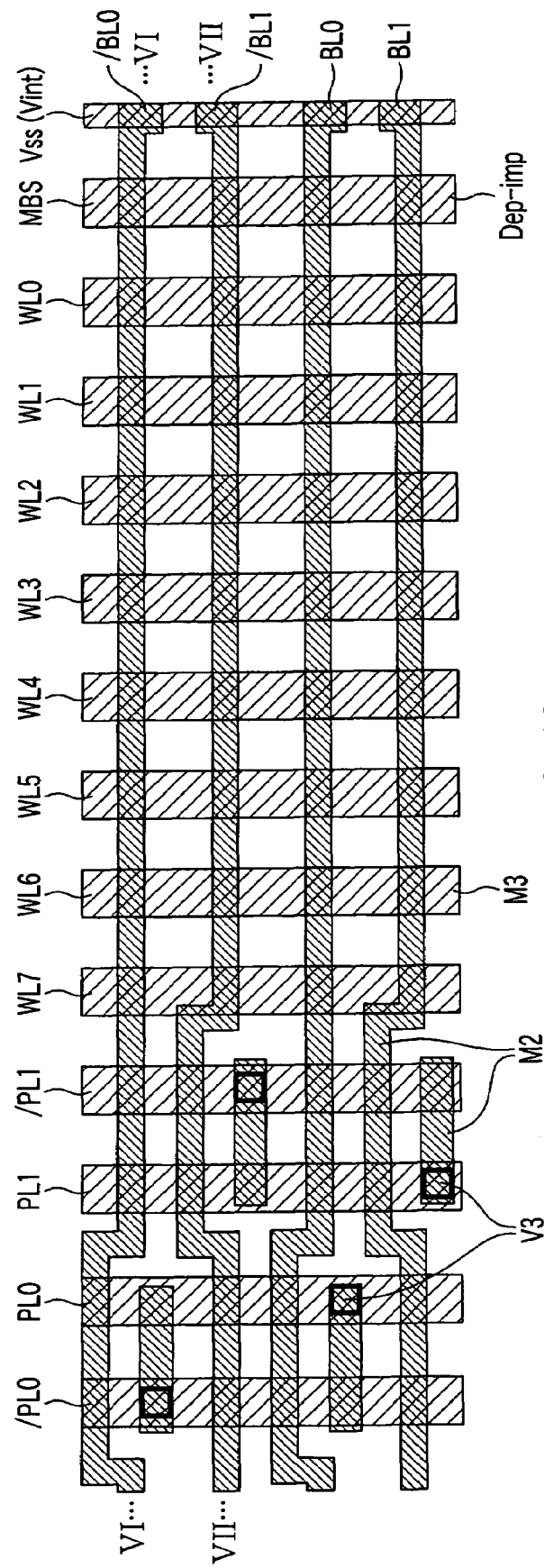
FIG. 12 is a layout chart obtained by extracting some layer from the layout chart in FIG. 8.

FIGS. 6 and 7 show different sectional structures of the memory cell array of the ferroelectric random access memory in FIG. 4. FIGS. 8 to 12 show layout charts of the memory cell blocks of the ferroelectric random access memory in FIG. 4. FIG. 8 shows all main layers of a layout for realizing the memory cell block, and FIGS. 9 to 12 separately show the main layers in FIG. 8 to distinguish the main layers from each other. A section along a VI—VI line in FIG. 12 is shown in FIG. 6, and a section along a VII—VII line in FIG. 12 is shown in FIG. 7.

In FIGS. 6 to 12, reference symbol AA denotes a diffusion layer; GC denotes a gate electrode wire of a transistor; Dep-Imp denotes an ion-implantation (Depletion Implantation) region for making the threshold voltage of an NMOS transistor negative; BE denotes a lower electrode of the ferroelectric capacitor; FE denotes a ferroelectric film of the ferroelectric capacitor; and TE denotes an upper electrode of the ferroelectric capacitor. Reference symbols M1, M2, and M3 denote first, second, and third metal wires; CP denotes a cell plug which is a contact for connecting the diffusion layer AA and the lower electrode BE; V1 denotes a contact for connecting the diffusion layer AA and the first metal wire M1; V2 denotes a contact for connecting the first metal wire M1 and the second metal wire M2; and V3 denotes a contact for connecting the second metal wires M2 and the third metal wire M3. Reference symbol MBS denotes a Main Block Selector signal line for selecting a memory cell block when a hierarchical array configuration of Sub Row Decoder/Main Row Decoder is employed. The names of other signal lines are the same as those in FIG. 4.

When the wires and block selection signal lines /BS and BS in the memory cell block are constituted by wires GC, the wiring resistance increases. For this reason, as shown in FIGS. 6 and 7, wires for the same signal in the memory cell block are formed by using the first metal wire M1, and a shunt scheme in which the metal wire M1 is brought into contact with the wire GC is employed every bit lines (for example, 32 bit lines, 64 bit lines, 128 bit lines, 256 bit lines, 1024 bit lines, and the like). The contact region is not shown in FIGS. 6 and 7. The second metal wire M2 is used as a connection wire for realizing wires for the bit lines and the plate lines of four types without increasing the memory cell block size of the embodiment. The third metal wire M3 is used as a shunt wire for decreasing the resistances an MBS signal for employing a hierarchical configuration and signals WL0 to WL7 of a wire GC of a Sub Row Decoder and wires for the plate lines (/PL0, /PL1, PL0, and PL1). As shown in FIGS. 6 and 7, a part of the wiring layer M3 can be used as a power supply line Vss or other power supply wires. In this manner, power supplies can be arranged in units of memory cell blocks to make it possible to strengthen the power supplies.

As shown in FIG. 4, the four plate lines can be shared by the left and right memory cell blocks. For this reason, two plate lines are necessary for each memory cell block. In the examples in FIGS. 6 to 12, the plate lines PL1 and /PL1 formed by the third metal wire M3 are temporarily connected to the second metal wire M2 through the contact V3, and the second metal wire M2 is connected to the first metal wire M1 through the contact V2. In this manner, as shown in FIG. 7, any one of the plate lines /PL1 and PL1 can be connected to the first metal wire M1. The connection using the second metal wire M2 can be realized by arranging the second metal wire M2 for connecting plate lines between the bit lines as shown in FIGS. 11 and 12. On the section in FIG.

7, the wire of the bit line /BL1 is discontinuously shown at a position where the plate line /PL1 is present. However, in fact, the wire of the bit line /BL1 is deviously connected to the plate line /PL1 in the depth direction of the drawing.

As shown in FIGS. 6 to 12, even though the two plate lines are arranged per memory cell block, memory cells can be arranged from a memory cell block end. For this reason, it is understood that the memory cell block size does not increase. With this configuration, as described above, both inter-bit-line noise and other array noise can be reduced without increasing the memory cell block size, an occupied area of sense amplifier circuits can be reduced by about half, and a power consumption of the memory cell array in an operation can be reduced by about half.

First Modification of First Embodiment

Figure 13:
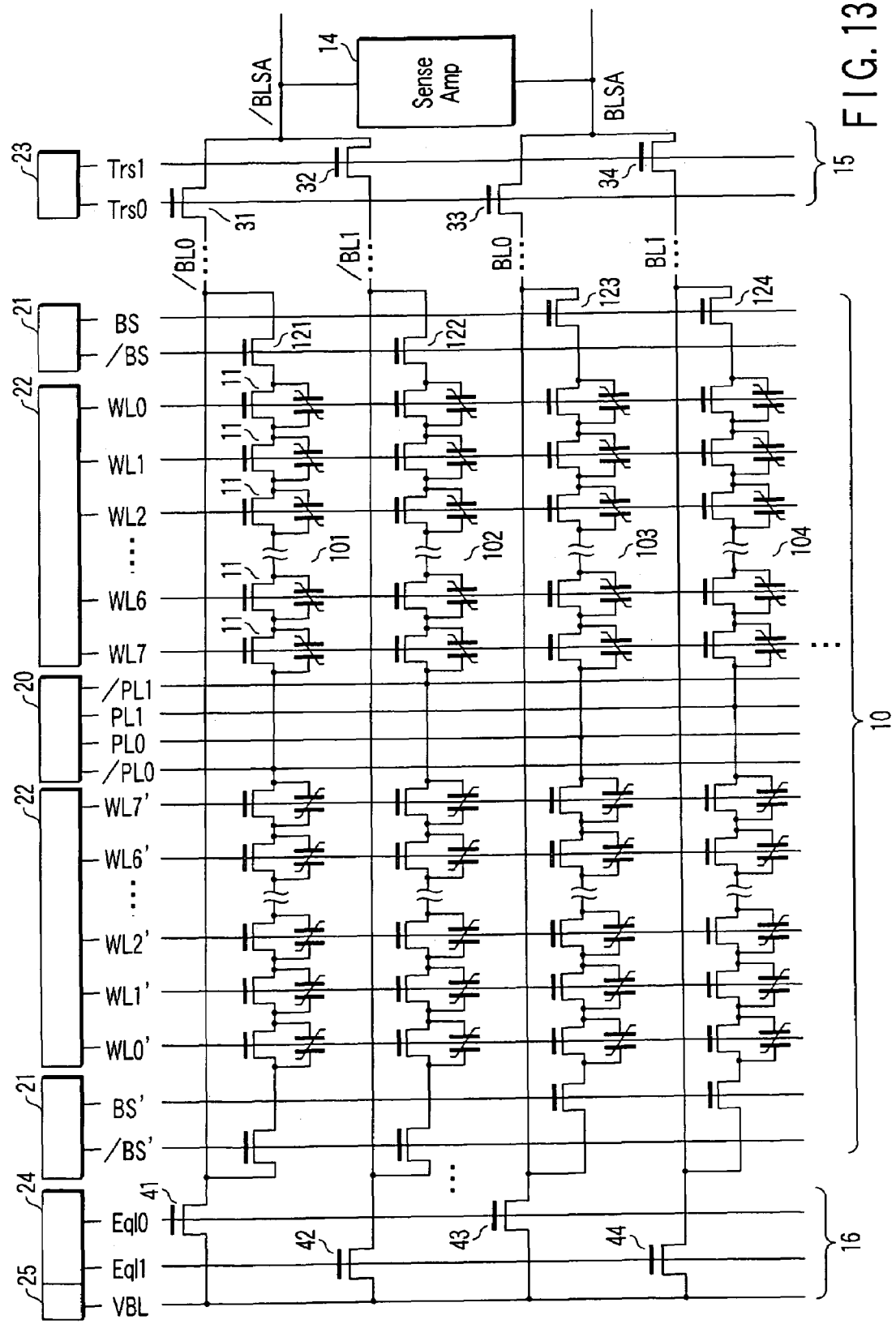
FIG. 13 is a circuit diagram of a ferroelectric random access memory according to a first modification of the first embodiment.

FIG. 13 is an equivalent circuit diagram according to a first modification of the ferroelectric random access memory in FIG. 4. The ferroelectric random access memory in FIG. 13 has almost the same configuration as that in the ferroelectric random access memory in FIG. 4 except that a bit line voltage equalizing circuit 16 used to shield bit lines, control lines Eq10, Eq11, and VBL are arranged on the other-end side of the memory cell array 10, i.e., on a side opposing a sense amplifier circuit 14. More specifically, a sense amplifier connection switch circuit 15 is connected on one ends of the bit lines of the memory cell array 10, and the bit line voltage equalizing circuit 16 is connected to the other ends of the bit lines.

According to the ferroelectric random access memory in FIG. 13, the same effect as that in the circuit in FIG. 4 can be obtained, complex wiring is advantageously unnecessary between the memory cell array 10 and the sense amplifier circuit 14.

Second Modification of First Embodiment

FIG. 14 is a waveform chart according to a second modification of the ferroelectric random access memory in FIG. 4. This modification shows a case in which memory cell data of the ferroelectric capacitor C1 selected in selection of the word line WL1 of the second memory cell block 102 connected to the bit line /BL1 in FIG. 4 is read or written. The operation shown in FIG. 14 is almost the same as the operation shown in FIG. 5 except that a plate line voltage in a stand-by state is set to be a voltage VBL higher than the voltage Vss, and a bit line voltage when a bit line is shielded is set to be the voltage VBL higher than the voltage Vss. In this manner, in the stand-by state, a difference voltage between an inter-gate-source voltage and an inter-gate-drain voltage applied to the cell transistors by the word lines WL0 to WL7 set at a voltage Vpp can be reduced to Vpp−VBL to make it possible to improve the reliability of TDDB or the like. When the bit line /BLSA and the bit line BLSA are temporarily precharged again before the block selection signal line /BS is activated, a voltage difference Vaa−Vss is applied to the selected memory cell, and memory cell data can be read or written for the bit line pair /BL1 and BL1. Upon completion of the read/write operation, when all the bit lines and all the plate lines are returned to the voltage VBL, the operation is terminated.

Figure 5:
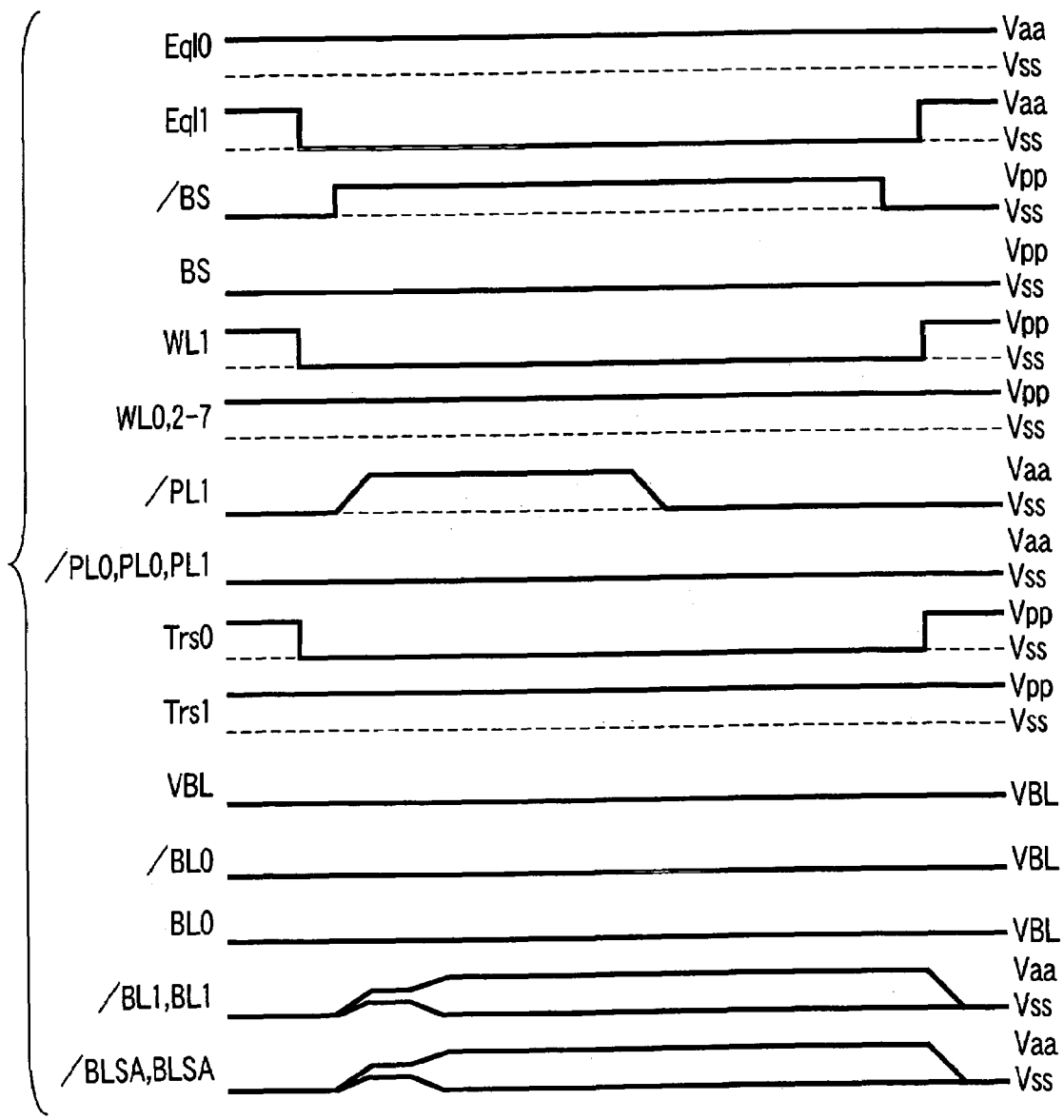
FIG. 5 is a waveform chart showing an operation of the circuit in FIG. 4.

According to the operation shown in FIG. 14, the same effect as that in the operation shown in FIG. 5 can be obtained, both inter-bit-line noise and other array noise can be reduced without increasing a memory cell block size, the occupied area of sense amplifier circuits can be reduced by about half, and a power consumption of the memory cell array in an operation can be reduced by half.

Third Modification of First Embodiment

Figure 15:
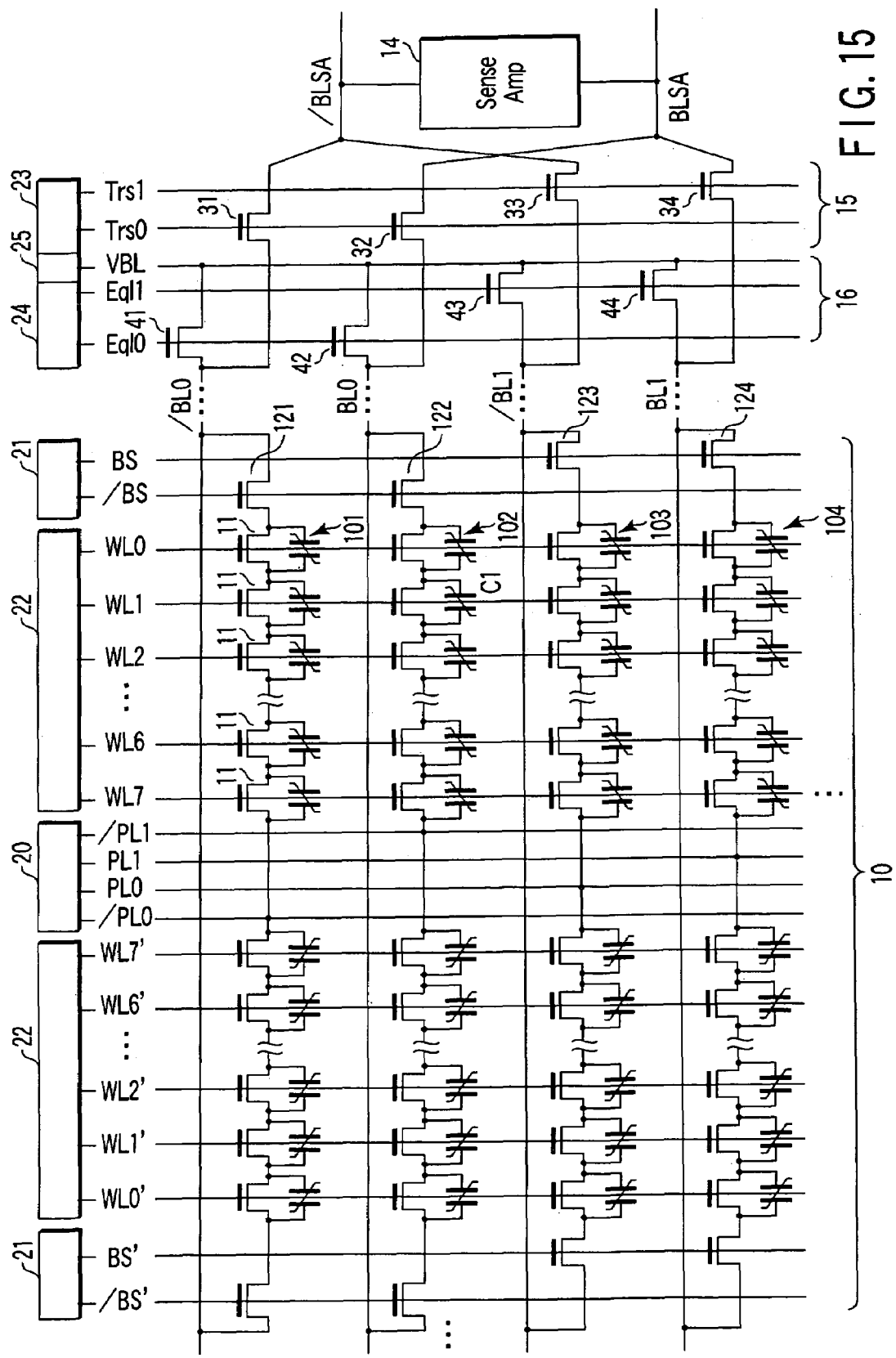
FIG. 15 is a circuit diagram of a ferroelectric random access memory according to a third modification of the first embodiment.

FIG. 15 is a circuit diagram according to a third modification of the ferroelectric random access memory in FIG. 4. The ferroelectric random access memory in FIG. 15 almost has the same configuration as that in the ferroelectric random access memory in FIG. 4 except that two bit lines constituting a bit line pair are adjacently arranged. More specifically, four bit lines /BL0, BL0, /BL1, and BL1 are sequentially arranged. In other words, the bit line pair /BL0 and BL0 and the bit line pair /BL1 and BL1 are adjacently arranged.

According to the ferroelectric random access memory in FIG. 15, almost the same effect as that in the ferroelectric random access memory in FIG. 4 can be obtained. With respect to noise caused by a parasitic capacity between bit lines, inter-bit-line-pair noise is reduced by shielding, but the noise remains because the two bit lines are adjacent to each other in the bit line pair. However, in comparison with a case in which a measure for reducing the inter-bit-line-pair noise is not performed, the noise is reduced by half.

Second Embodiment

Figure 16:
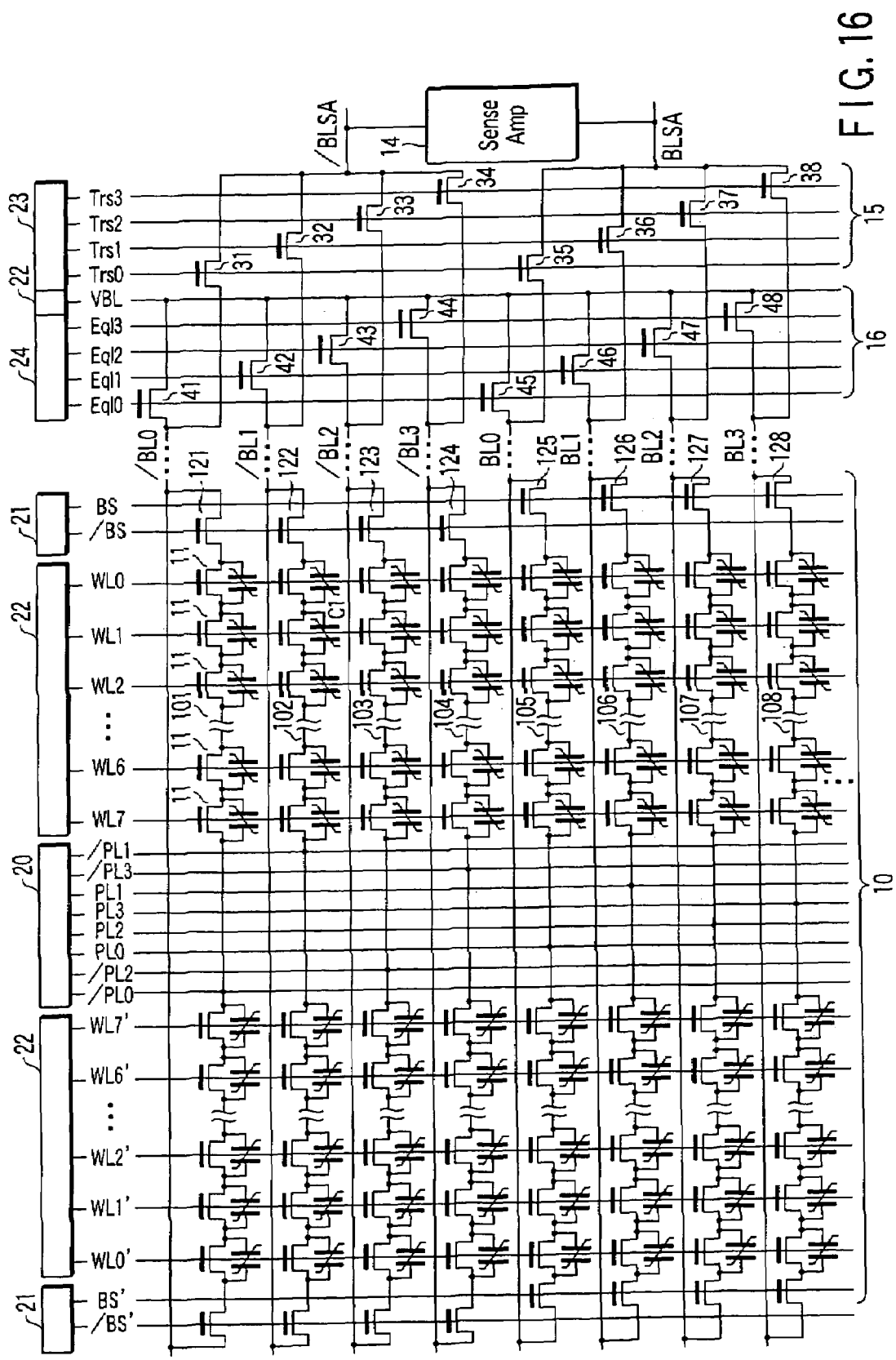
FIG. 16 is a circuit diagram of a ferroelectric random access memory according to a second embodiment.

FIG. 16 is a circuit diagram of a ferroelectric random access memory according to a second embodiment of the present invention. The configuration of the ferroelectric random access memory in FIG. 16 is partially the same as that in the first embodiment except for the following points.

(a) Eight memory cell blocks consisting of first to eighth memory cell blocks 101 to 108 sequentially adjacently arranged in a row direction of a memory cell array 10 constitute one block group.

(b) One ends of the first to eighth memory cell blocks 101 to 108 are connected to first to eighth plate lines /PL0, /PL1, /PL2, /PL3, PL0, PL1, PL2, and PL3, respectively. The first to eighth plate lines /PL0, /PL1, /PL2, /PL3, PL0, PL1, PL2, and PL3 are driven by a plate line drive circuit 20.

(c) The other ends of the first to eighth memory cell blocks 101 to 108 are connected to the eight bit lines /BL0, /BL1, /BL2, /BL3, BL0, BL1, BL2, and BL3 through first to eighth block selection transistors 121 to 128, respectively. A sense amplifier circuit 14 is arranged on an one-end side of the memory cell array 10 in the column direction every block group constituted by the first to eighth memory cell blocks 101 to 108. First to eighth block selection transistors 121 to 128 are provided. The gate electrodes of the first to fourth block selection transistors 121 to 124 are commonly connected to the first block selection signal line /BS. The gate electrodes of the fifth to eighth block selection transistors 125 to 128 are commonly connected to the second block selection signal line BS different from the first block selection signal line. The first and second block selection signal lines /BS and BS are driven by a block selection signal drive circuit 21.

(d) The first bit line /BL0 and the fifth bit line BL0 constitute a first bit line pair, and the second bit line /BL1 and the sixth bit line BL1 constitute a second bit line pair, the third bit line /BL2 and the seventh bit line BL2 constitute a third bit line pair, and the fourth bit line /BL3 and the eighth bit line BL3 constitute a fourth bit line pair.

(e) Sense amplifier connection switch circuits 15 constituted by first to eighth sense amplifier connection switch transistors 31 to 38 is inserted between the first to eighth bit lines and the sense amplifier circuit 14. First to fourth sense amplifier connection switch control lines Trs0 to Trs3 are arranged to extend in the row direction of the memory cell array. The first sense amplifier connection switch control line Trs0 is commonly connected to the gate electrodes of the first and fifth sense amplifier connection switch transistors 31 and 35, the second sense amplifier connection switch control line Trs1 is commonly connected to the gate electrodes of the second and sixth sense amplifier connection switch transistors 32 and 36, the third sense amplifier connection switch control line Trs2 is commonly connected to the gate electrodes of the third and sixth sense amplifier connection switch transistors 33 and 37, and the fourth sense amplifier connection switch control line Trs3 is commonly connected to the gate electrodes of the fourth and eighth sense amplifier connection switch transistors 34 and 38. The first to fourth sense amplifier connection switch control lines Trs0 to Trs3 are driven by a switch control line drive circuit 23.

(f) A bit line voltage equalizing circuit 16 constituted by first to eighth bit line voltage equalizing switch transistors 41 to 48 is inserted between the first to eighth bit lines and a bit line voltage supply line VBL. First to fourth equalization control lines Eq10 to Eq13 are arranged to extend in the row direction of the memory cell array. The first equalization control line Eq10 is commonly connected to the gate electrodes of the first and fifth bit line voltage equalizing switch transistors 41 and 45, the second equalization control line Eq11 is commonly connected to the gate electrode of the second and sixth bit line voltage equalizing switch transistors 42 and 46, the third equalization control line Eq12 is commonly connected to the gate electrodes of the third and seventh bit line voltage equalizing switch transistors 43 and 47, and the fourth equalization control line Eq13 is commonly connected to the gate electrode of the fourth and eighth bit line voltage equalizing switch transistors 44 and 48. The first to fourth equalization control lines Eq10 to Eq13 are driven by an equalization control line drive circuit 24, and the bit line voltage supply line VBL is driven by a bit line drive circuit 25.

The sense amplifier connection switch circuit 15 and the bit line voltage equalizing circuit 16 select any one of the four bit lines /BL0, /BL1, /BL2, and /BL3 in a sense operation to connect the selected bit line to one bit line /BLSA of the sense amplifier circuit 14 and to connect the unselected remaining bit lines to the constant voltage VBL. The sense amplifier connection switch circuit 15 and the bit line voltage equalizing circuit 16 select any one of the four bit lines /BL0, /BL1, /BL2, and /BL3 to connect the selected bit line to the other bit line BLSA of the sense amplifier circuit 14 and to connect the unselected remaining bit lines to the constant voltage VBL. In other words, in the sense operation, any one of the first, second, third, and fourth bit line pairs is selected, the selected bit line pair is connected to the sense amplifier circuit 14, and the three unselected remaining bit line pairs can be kept at the constant voltage VBL.

Although the memory cell blocks are arranged on both the sides of the sense amplifier circuit 14, the memory cell block on one side is omitted in FIG. 16.

Figure 17:
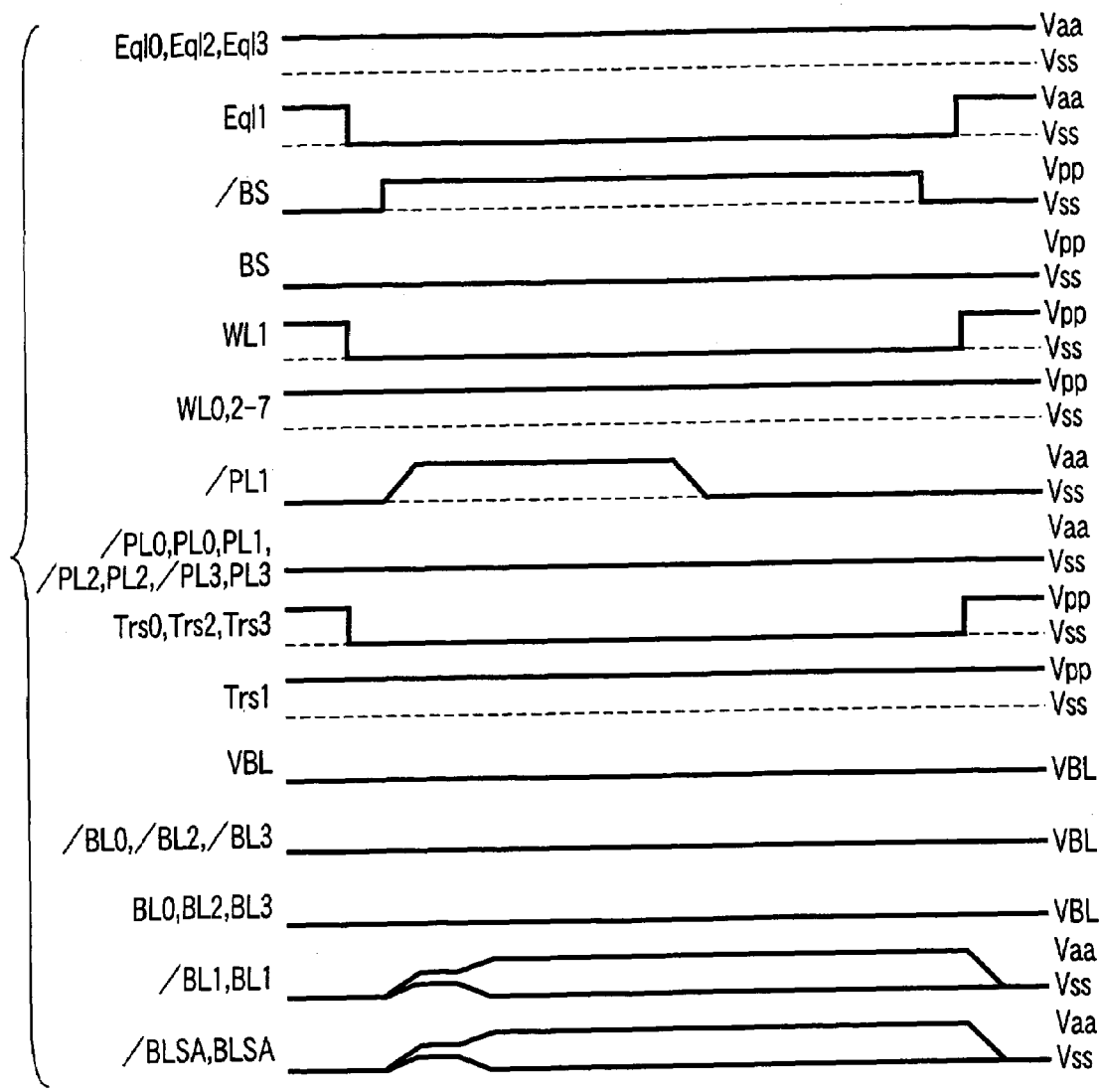
FIG. 17 is a waveform chart showing an operation of the circuit in FIG. 16.

An operation of the ferroelectric random access memory in FIG. 16 will be described below with reference to FIG. 17. This example shows a case in which memory data in the ferroelectric capacitor C1 selected in selection of the word line WL1 in the second memory cell block 102 in FIG. 16 is read/written.

In this operation, of the bit line equalization signal lines Eq10 to Eq13, only the bit line equalization signal line Eq11 is driven to Low, one bit line pair /BL1 and BL1 is set in a floating state, and the remaining bit line pairs /BL0, BL0, /BL2, BL2, and /BL3, BL3 are fixed to Vss (=VBL).

Almost simultaneously with the above operation, of the sense amplifier connection switch control lines Trs0 to Trs3, the sense amplifier connection switch control lines Trs0, Trs2, and Trs3 are driven to Low. With respect to the bit lines /BL1 and BL1, the memory cell array 10 and the sense amplifier circuit 14 are connected to each other, and the bit lines /BL0, BL0, /BL2, BL2, and /BL3, BL3 are disconnected from the sense amplifier circuit 14 and fixed to the voltage Vss. In this manner, the bit lines /BL1 and BL1 are connected to the sense amplifier circuit 14 as a bit line pair operated in a folded bit line configuration, and the bit lines /BL0, BL0, /BL2, BL2, /BL3, and BL3 are inserted between operating bit lines and function as shield bit lines which shield interference between the operating bit lines.

Almost simultaneously with this operation, in order to select and turn off a cell transistor connected in parallel to the ferroelectric capacitor C1 in the second memory cell block 102, the word line WL1 is driven to Low, the block selection signal line /BS is driven to High so as to select the second memory cell block 102, and cell data is not read from the sixth memory cell block 106. More specifically, the block selection signal line BS is kept at Low not to select the sixth memory cell block 106.

Of the eight plate lines, only the plate line /PL1 connected to the selected second memory cell block 102 is raised from Vss to a High level. In this manner, a voltage difference between the plate line /PL1 and the bit line /BL1 is applied to the selected ferroelectric capacitor C1, and cell data is read on the bit line /BL1 and transferred to the bit line /BLSA of the sense amplifier circuit 14. At this time, since the second block selection signal line BS is at Low, the block selection transistor 126 connected to the sixth memory cell block 106 is in an OFF state. Therefore, cell data is not read from the sixth memory cell block 106 onto the bit line BL1 serving as a reference bit line, and a folded bit line configuration can be realized by the bit line pair /BL1 and BL1.

When a voltage having an intermediate value between "1" data and "0" data of the read bit line /BL1 is generated on the bit line BL1 by a dummy cell circuit built in the sense amplifier circuit or the like, a 1 T1 C operation can be realized. At this time, in the sixth memory cell block 106, the cell transistors connected to the word line WL1 are turned off. However, the plate line /PL1 is kept at Vss, and the block selection signal line BS is at Low. For this reason, data breakdown does not occur.

In the first, third, and fourth memory cell blocks 101, 103, and 104 connected to the shield bit lines /BL0, /BL2, and /BL3, the cell transistors connected to the word line WL1 are turned off. The plate lines /PL0, /PL2, and /PL3 are at Vss, and the block selection signal line /BS is at High. For this reason, the first, third, and fourth memory cell blocks and the bit lines /BL0, /BL2, and /BL3 are connected to each other, respectively. However, the bit lines /BL0, /BL2, and /BL3 are fixed to the voltage Vss, and no voltage is applied to all the memory cells, so that the memory cell blocks are not adversely affected.

In the fifth, seventh, and eighth memory cell blocks 105, 107, and 108 connected to the shield bit lines BL0, BL2, and BL3, respectively, the cell transistors connected to the word line WL1 are turned off. However, the plate line PL0 is at Vss, and the block selection signal line BS is at Low. For this reason, no voltage is applied to all the memory cells, and the memory cell blocks are not adversely affected.

Thereafter, a voltage difference between the bit lines /BL1 and BL1 (between /BLSA and BLSA) is amplified by the sense amplifier circuit 14 and read out of the chip. At this time, the data outside the chip is written in the bit line pair /BL1 and BL1 (/BLSA and BLSA). When the plate line /PL1 is at High, the "0" data is written back in the memory cell if the voltage of the bit line /BL1 is at Low. Thereafter, when the plate line /PL1 goes to Low, the "1" data is written back in the memory cell if the voltage of the bit line /BL1 is at High. Subsequently, the block selection signal line /BS returns to Low, the word line WL1 returns to High, the equalization control line Eq11 returns to High, and the sense amplifier connection switch control lines Trs0, Trs2, and Trs3 return to High. At this time, a series of write operations are terminated.

As described above, memory cell data is read on any one of the bit lines /BL and BL1, and the other bit line is used as a reference bit line, so that a read operation of the folded bit lines can be performed. In this manner, array noise caused by noise from the word lines (WL0 to WL7), the plate lines, the substrate, and the like in the memory cell array is reduced. The six remaining bit lines are fixed to a fixed voltage to function as shield bit lines, so that array noise caused by a parasitic capacity between the bit lines can be reduced. As in the above description, when a read operation is performed by using the bit lines /BL0 and BL0 as the folded bit lines, when a read operation is performed by using the bit lines /BL2 and BL2 as folded bit lines, or when an operation is performed by using the bit lines /BL3 and BL3 as folded bit lines, the six remaining bit lines can be used as shield bit lines.

With the above configuration, only one sense amplifier circuit is required every eight bit lines. Therefore, the number of sense amplifier circuits can be ¼ the number of sense amplifiers used when the sense amplifier is arranged every two bit lines. Of the eight bit lines, six bit lines function as shield bit lines. For this reason, a power consumption of the cell array in an operation can be reduced by ¼. In addition, various signal lines arranged in a direction perpendicular to the bit lines can be freely changed in position in units of memory cell blocks. For this reason, eight plate lines are arranged on a memory cell, so that the memory cell block can be prevented from increasing in size.

In this embodiment, in order to read cell data on one of eight bit lines, eight plate lines and two block selection signal lines are used. The reason why the memory cell array can be realized by the block selection signal lines of two types is that one block selection signal line is used to read cell data from at least one bit line and the other block selection signal line is used to separate a reference bit line which amplitude-operates from the memory cell block. The characteristic point of the embodiment is as follows. That is, when the other shield bit lines are set at a voltage equal to the plate line voltage, the block selection transistor may be turned on or off. For this reason, an excessive block selection signal is not necessary. Although the four plate lines are necessary in the embodiment, the plate lines can be arranged without increasing a cell block size (as will be described later with reference to FIGS. 18 to 24). When eight block selection signals are used, the memory cell block size increases.

In this embodiment, the "1" and "0" data are also written in two ferroelectric capacitors to make it possible to perform a 2 T 2 C operation. In this case, in the operation, both the block selection signal lines /BS and BS are set at High, and the plate lines /PL0 and PL0, the plate line /PL1 and the bit line BL1, the plate lines /PL2 and PL2, or the plate lines /PL3 and PL3 are selected, reverse data is read on the reference bit line. For this reason, a dummy cell circuit is not necessary.

Figure 18:
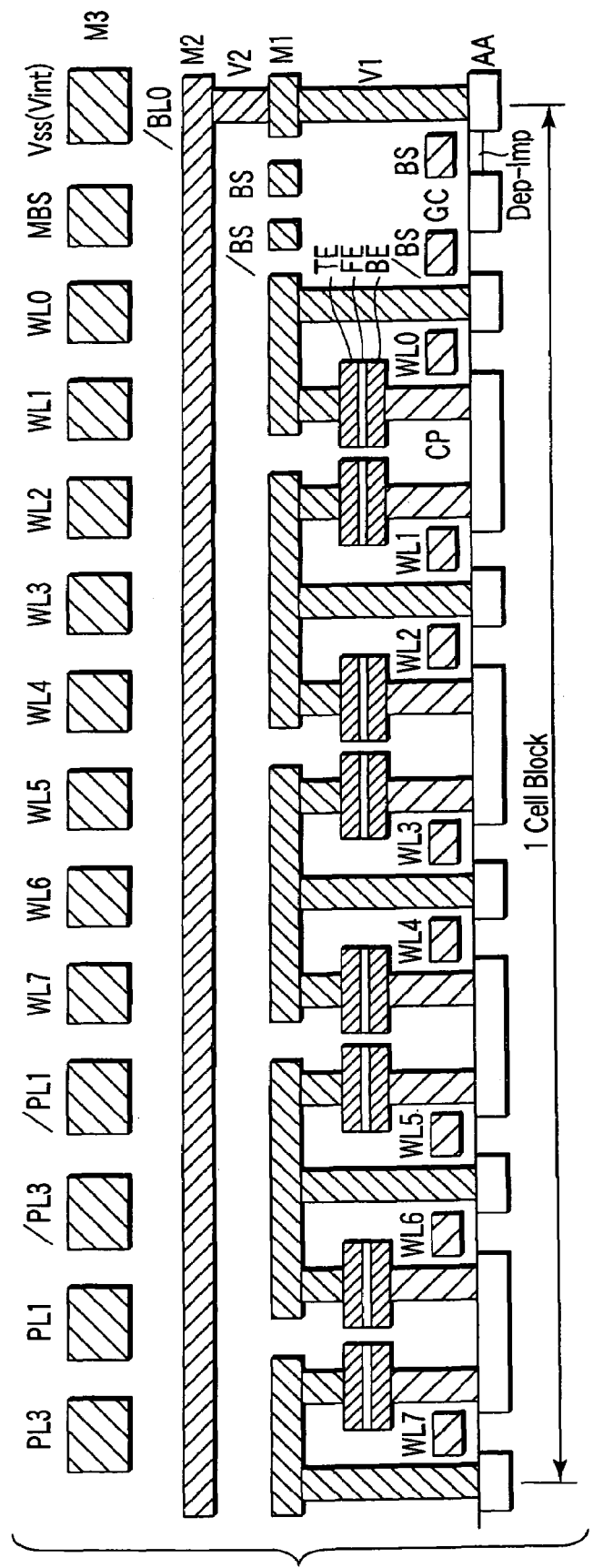
FIG. 18 is a sectional view showing the structure of a part of a memory cell array of the ferroelectric random access memory in FIG. 16.
Figure 19:
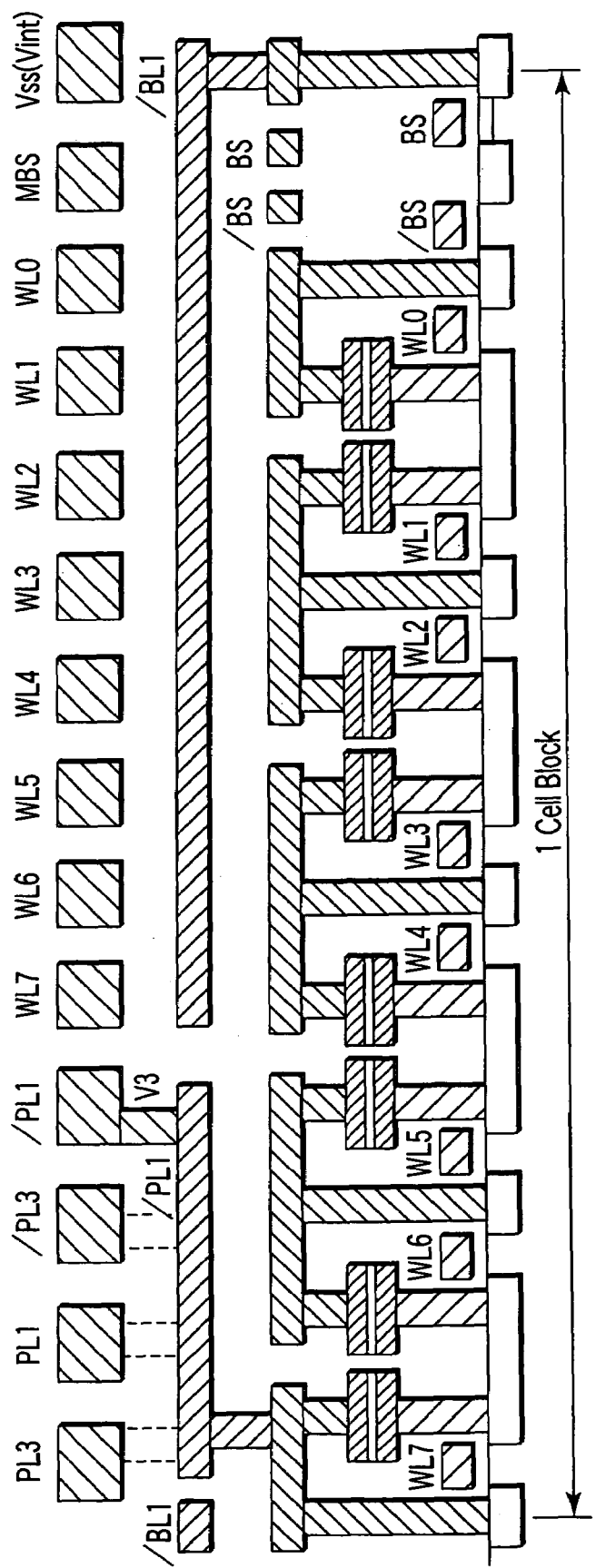
FIG. 19 is a sectional view showing the structure of another part of the memory cell array of the ferroelectric random access memory in FIG. 16.
Figure 20:
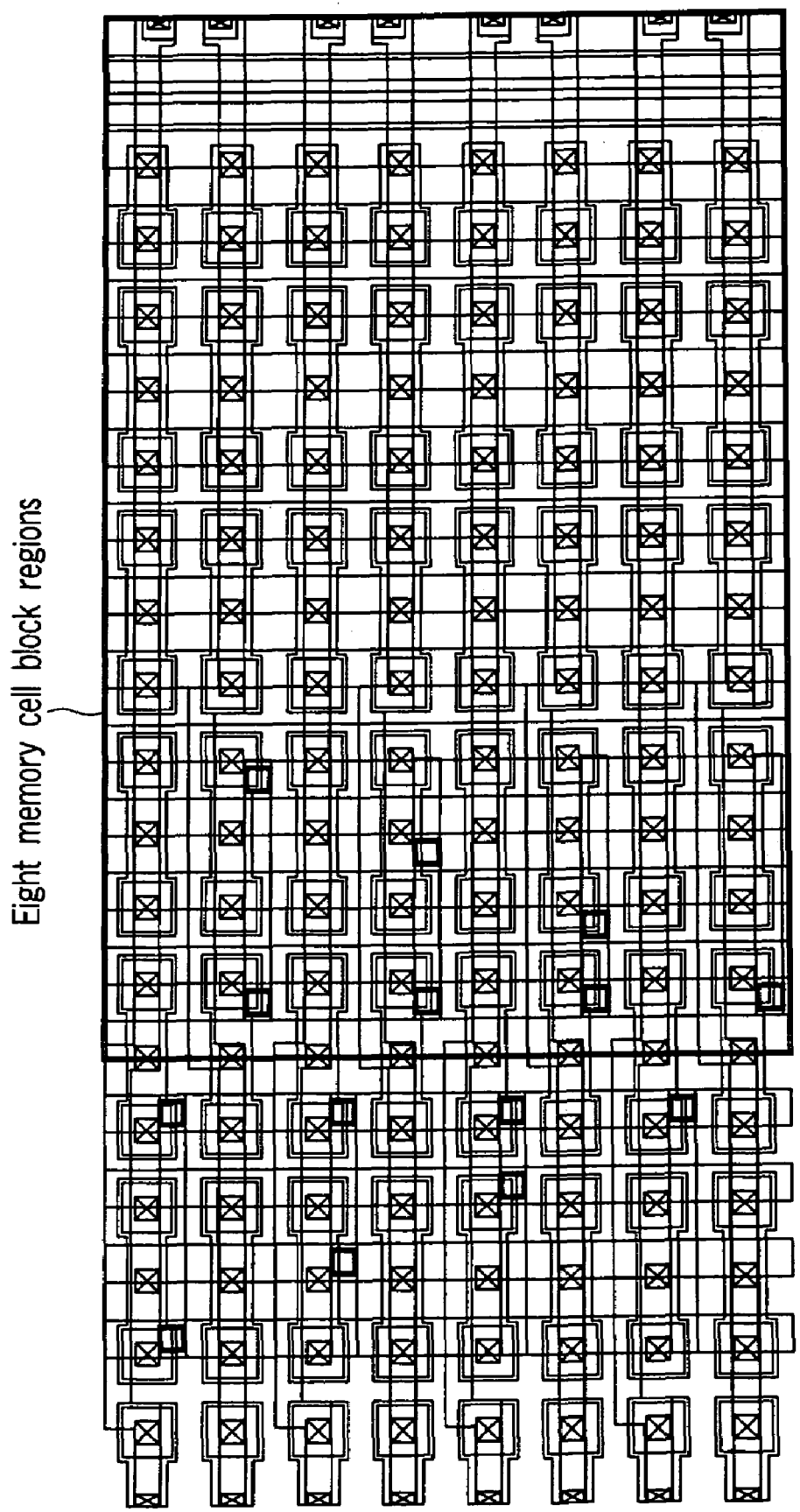
FIG. 20 is a multi-layered layout chart of the ferroelectric random access memory in FIG. 16.
Figure 21:
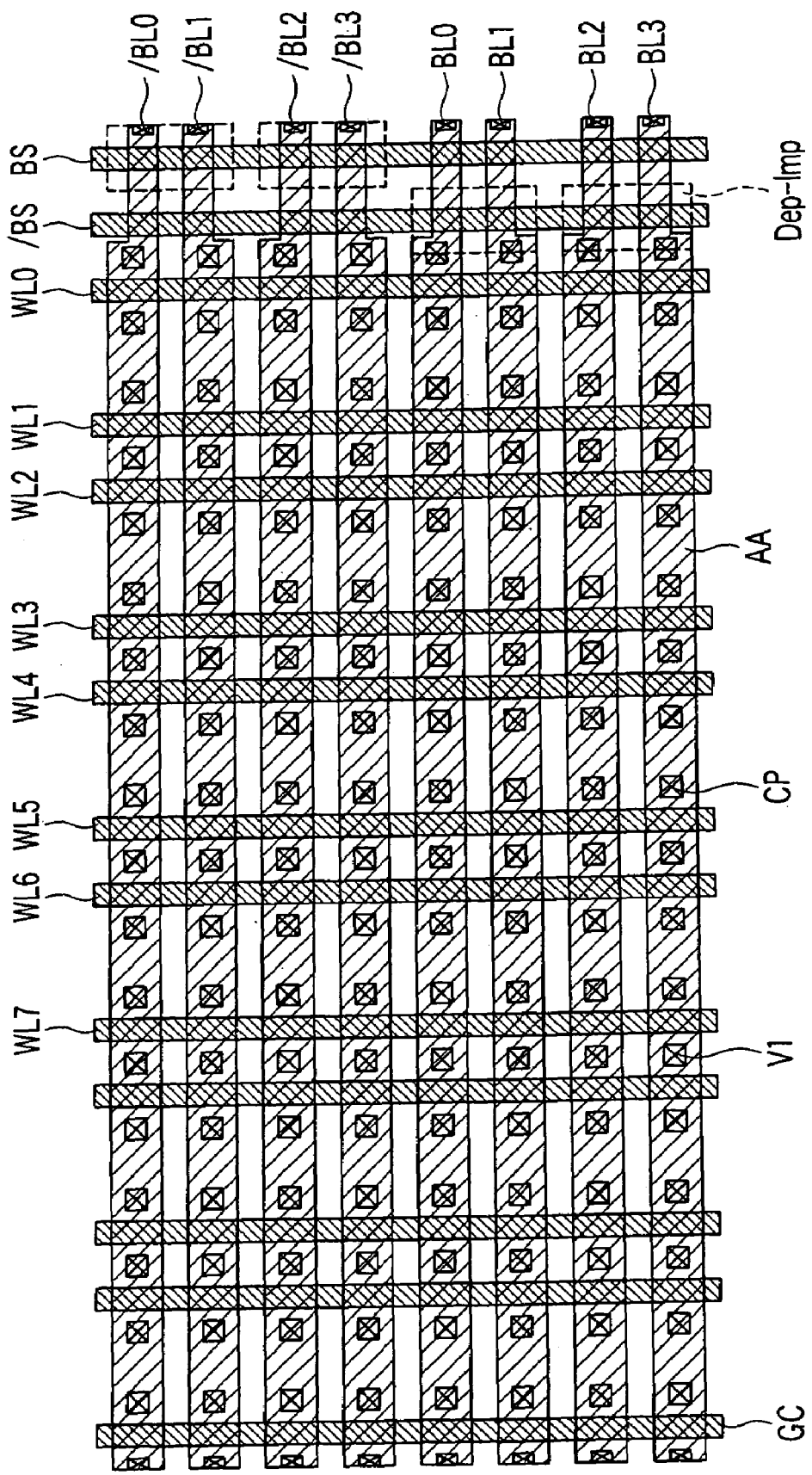
FIG. 21 is a layout chart obtained by extracting some layer from the layout chart in FIG. 20.
Figure 22:
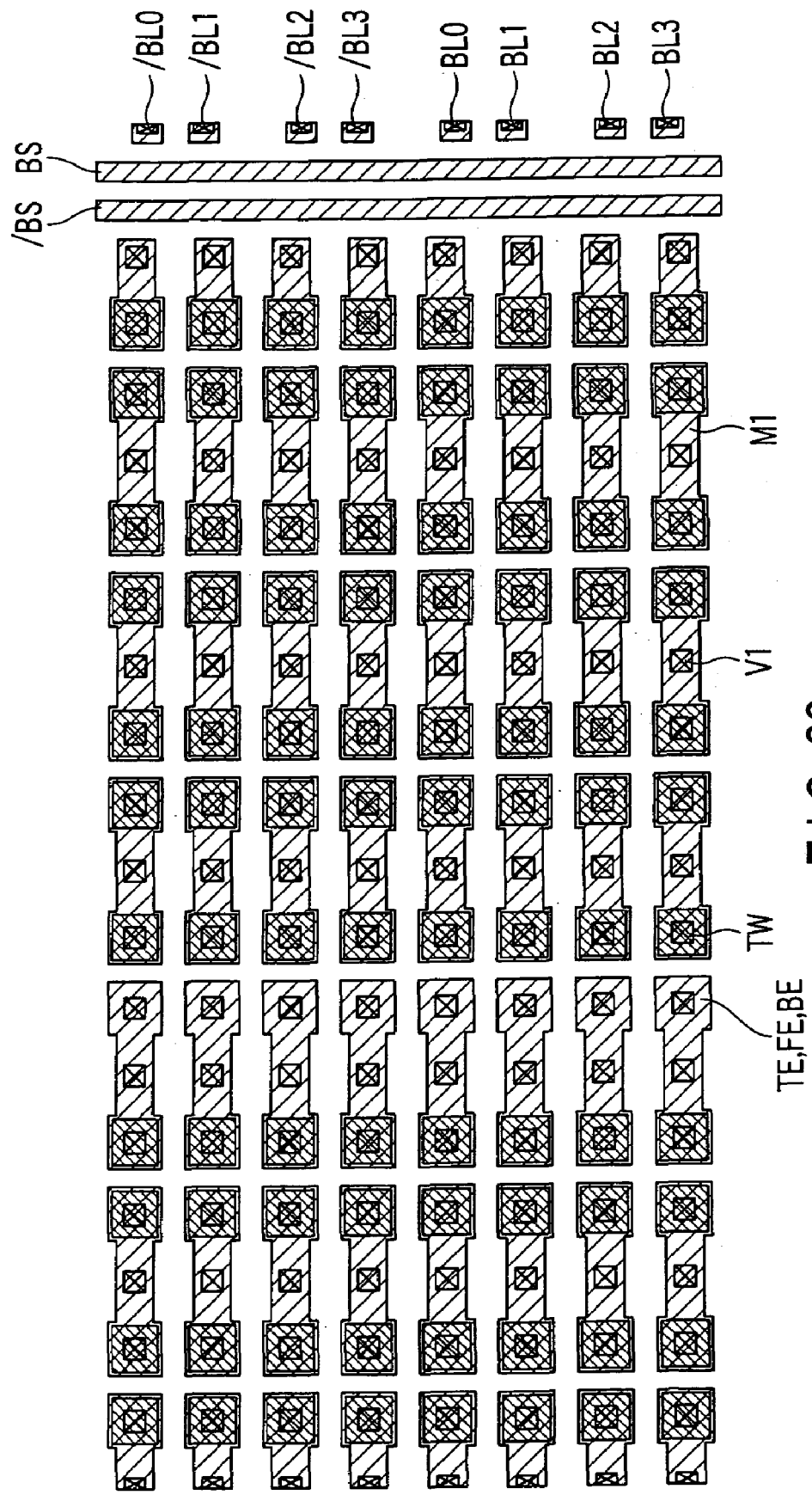
FIG. 22 is a layout chart obtained by extracting some layer from the layout chart in FIG. 20.

FIGS. 18 and 19 show different sectional structures of the memory cell array of the ferroelectric random access memory in FIG. 16. FIGS. 20 to 24 show layout charts of the ferroelectric random access memory in FIG. 16. FIG. 20 shows all main layers of a layout for realizing the memory cell block, and FIGS. 21 to 24 separately show the main layers in FIG. 19 to easily distinguish the main layers from each other. A section along an XVIII—XVIII line in FIG. 24 corresponds to FIG. 18, and a section along an XIX—XIX line in FIG. 24 corresponds to FIG. 19.

In FIGS. 18 to 24, reference symbol AA denotes a diffusion layer; GC denotes a gate electrode wire of a transistor; Dep–Imp denotes an ion-implantation (Depletion Implantation) region for making the threshold voltage of an NMOS transistor negative; BE denotes a lower electrode of the ferroelectric capacitor; FE denotes a ferroelectric film of the ferroelectric capacitor; and TE denotes an upper electrode of the ferroelectric capacitor. Reference symbols M1, M2, and M3 denote first, second, and third metal wires; CP denotes a cell plug which is a contact for connecting the diffusion layer AA and the lower electrode BE; V1 denotes a contact for connecting the diffusion layer AA and the first metal wire M1; V2 denotes a contact for connecting the first metal wire M1 and the second metal wire M2; and V3 denotes a contact for connecting the second metal wire M2 and the third metal wire M3. Reference symbol MBS denotes a Main Block Selector signal line for selecting a memory cell block when a hierarchical array configuration of Sub Row Decoder/Main Row Decoder is employed. The names of other signal lines are the same as those in FIG. 16.

When the wires in the memory cell block and the block selection signal lines /BS and BS are constituted by the wires GC, the wiring resistance increases. For this reason, as shown in FIGS. 18 and 19, wires for the same signal in the memory cell block are formed by using the first metal wire M1, and a shunt scheme in which the metal wire M1 is brought into contact with the wire GC is employed every bit lines (for example, 32 bit lines, 64 bit lines, 128 bit lines, 256 bit lines, 1024 bit lines, and the like). The contact region is not shown in FIGS. 18 and 19. The second metal wire M2 is used as a connection wire for realizing wires for the bit lines and the plate lines of four types without increasing the memory cell block size of the embodiment. The third metal wire M3 is used as a shunt wire for decreasing the resistances an MBS signal for employing a hierarchical configuration and signals WL0 to WL7 of a wire GC of a Sub Row Decoder and wires for the plate lines (/PL0, /PL1, PL0, PL1, /PL2, /PL3, PL2, and PL3). As shown in FIGS. 18 and 19, a part of the wiring layer M3 can be used as a power supply line Vss or other power supply wires. In this manner, power supplies can be arranged in units of memory cell blocks to make it possible to strengthen the power supplies.

Figure 23:
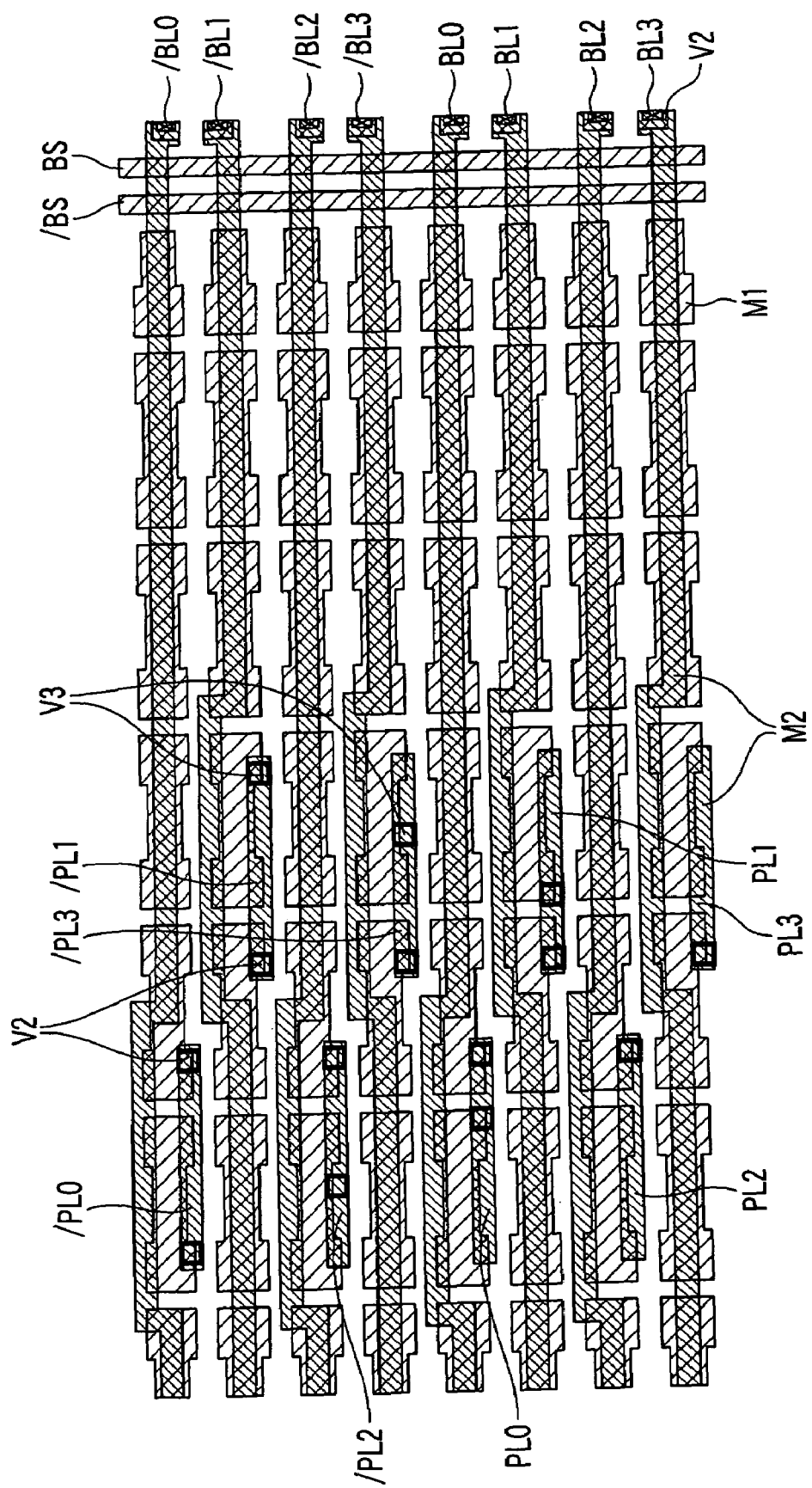
FIG. 23 is a layout chart obtained by extracting some layer from the layout chart in FIG. 20.
Figure 24:
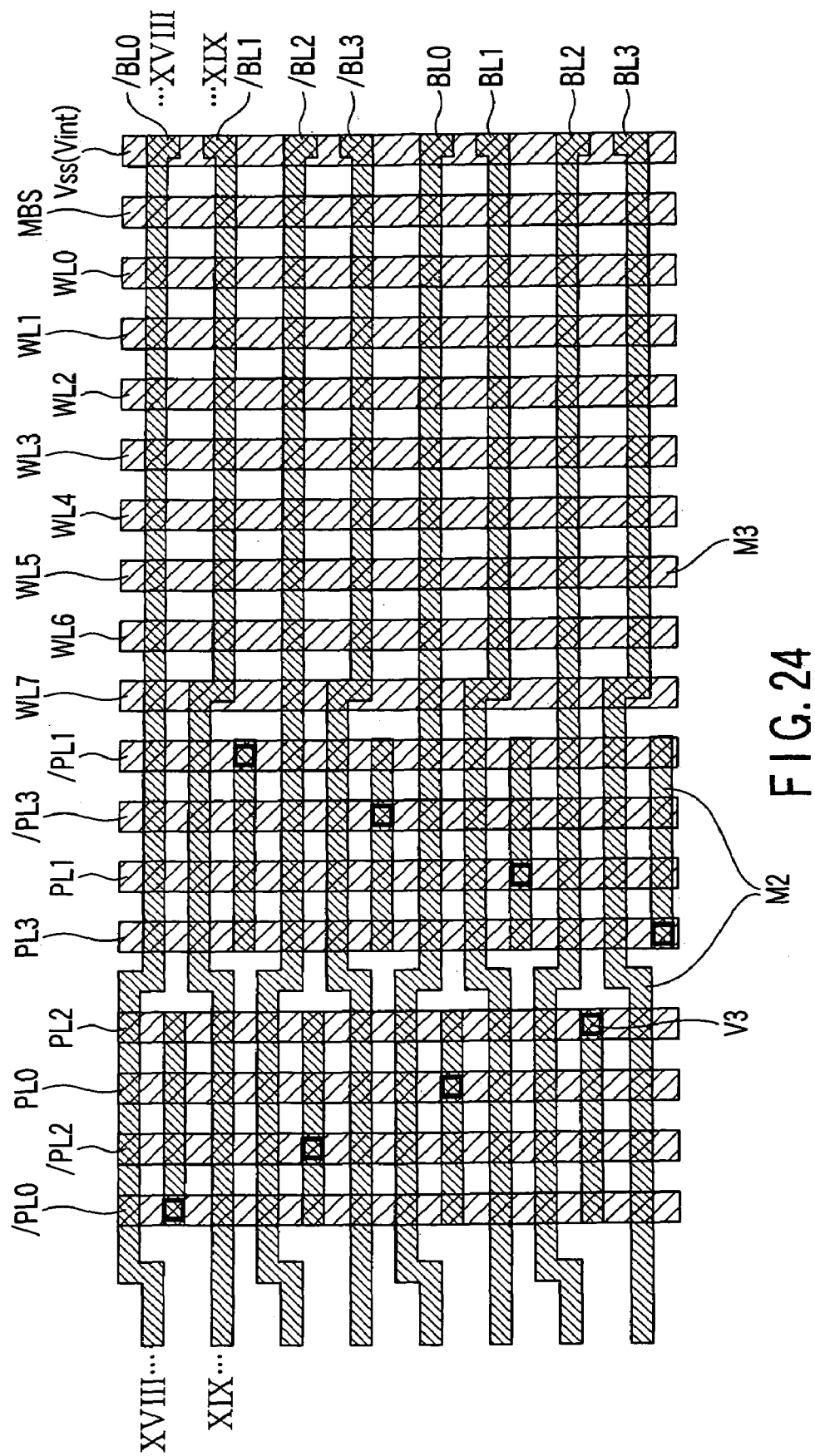
FIG. 24 is a layout chart obtained by extracting some layer from the layout chart in FIG. 20.

As shown in FIG. 16, the eight plate lines can be shared by the left and right memory cell blocks. For this reason, four plate lines are necessary for each memory cell block. In the examples in FIGS. 18 to 24, the plate lines PL1, /PL1, PL3, and /PL3 formed by the third metal wire M3 are temporarily connected to the second metal wire M2 through the contact V3, and the second metal wire M2 is connected to the first metal wire M1 through the contact V2. In this manner, as shown in FIG. 19, any one of the plate lines /PL1, PL1, PL3, and /PL3 can be connected to the first metal wire M1. The connection using the second metal wire M2 can be realized by arranging the second metal wire M2 for connecting plate lines between the bit lines as shown in FIGS. 23 and 24. On the section in FIG. 19, the wire of the bit line /BL1 is discontinuously shown at a position where the plate line /PL1 is present. However, in fact, the wire of the bit line /BL1 is deviously connected to the plate line /PL1 in the depth direction of the drawing.

As shown in FIGS. 18 to 24, even though the four plate lines are arranged per memory cell block, memory cells can be arranged from a memory cell block end. For this reason, it is understood that the memory cell block size does not increase. With this configuration, as described above, both inter-bit-line noise and other array noise can be reduced without increasing the memory cell block size, an occupied area of sense amplifier circuits can be reduced by about half, and a power consumption of the memory cell array in an operation can be reduced by about half.

First Modification of Second Embodiment

In the second embodiment, according to the ferroelectric random access memory of the first modification of the first embodiment shown in FIG. 13, a bit line voltage equalizing circuit 16 used to shield bit lines and control signal lines first to fourth equalization control lines Eq10, Eq11, Eq12, Eq13, and VBL thereof may be arranged on the other-end side of a memory cell array 10, i.e., on a side opposing the sense amplifier circuit 14 side. With this modification, the same effect as that of the ferroelectric random access memory in FIG. 13 can be obtained, complex wires between the memory cell array and the sense amplifier circuit are unnecessary advantageously.

Second Modification of Second Embodiment

In the second embodiment, according to the ferroelectric random access memory of the third modification of the first embodiment described with reference to FIG. 15, four bit lines constituting bit line pairs may be adjacent to each other, i.e., the eight bit lines /BL0, BL0, /BL1, BL1, /BL2, BL2, /BL3, and BL3 may be sequentially arranged in the order named. In this modification, the same effect as that in the circuit in FIG. 16 can be obtained. With respect to array noise caused by a parasitic capacity between bit lines, inter-bit-line-pair noise is reduced by shielding. Note that the noise remains because the two bit lines are adjacent to each other in the bit line pair. However, in comparison with a case in which a measure for reducing the inter-bit-line-pair noise is not performed, the noise is reduced by half.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A ferroelectric random access memory comprising;
    a memory cell array in which a plurality of memory cell blocks each obtained by series-connecting a plurality of memory cells each constituted by a cell transistor having source and drain terminals and a ferroelectric capacitor connected in parallel between the source and drain terminals of the cell transistor are arranged in the form of a matrix, a block group being constituted by first to fourth memory cell blocks sequentially adjacently arranged in a row direction;
    a plurality of word lines arranged to extend in the row direction of the memory cell array;
    a plurality of bit lines arranged to extend in a column direction of the memory cell array and including first to fourth bit lines, the first bit line and the third bit line constituting a first bit line pair, and the second bit line and the fourth bit line constituting a second bit line pair;
    a plurality of plate lines arranged to extend in the row direction of the memory cell array and including first to fourth plate lines to which one ends of the first to fourth memory cell blocks are connected, respectively;
    a plurality of sense amplifier circuits arranged on a one-end side of the memory cell array in the column direction every block group constituted by the first to fourth memory cell blocks;
    first to fourth block selection transistors connected between the other ends of the first to fourth memory cell blocks and the first to fourth bit lines, respectively;
    a first block selection signal line arranged to extend in the row direction of the memory cell array and commonly connected to gate electrodes of the first and second block selection transistors; and
    a second block selection signal line arranged to extend in the row direction of the memory cell array and commonly connected to gate electrodes of the third and fourth block selection transistors.

2. A ferroelectric random access memory according to claim 1, further comprising:
    a first switch circuit inserted between the first and second bit line pairs and said plurality of sense amplifier circuits, the first switch circuit selecting one bit line pair of the first and second bit line pairs to connect the selected bit line pair to the sense amplifier circuits.

3. A ferroelectric random access memory according to claim 2, wherein
    the first switch circuit has first to fourth transistors connected to the first to fourth bit lines and the sense amplifier circuits.

4. A ferroelectric random access memory according to claim 1, further comprising:
    a second switch circuit connected to the first bit line pair and the second bit line pair, the second switch circuit selecting one bit line pair of the first and second bit line pairs to connect the selected bit line pair to a constant voltage.

5. A ferroelectric random access memory according to claim 4, wherein
    the second switch circuit has fifth to eighth transistors connected between the first to fourth bit lines and a bit line voltage supply line to which a constant voltage is supplied.

6. A ferroelectric random access memory according to claim 1, further comprising:
    a first drive circuit which is connected to the first to fourth plate lines and selects at least one of the first to fourth plate lines to drive the selected plate line to a High level and to set the unselected remaining plate lines at a constant voltage.

7. A ferroelectric random access memory according to claim 6, wherein
    the first drive circuit selects the first and third plate lines or the second and fourth plate lines from the first to fourth plate lines to drive the selected plate lines to a High level and to set the unselected remaining plate lines at a constant voltage.

8. A ferroelectric random access memory according to claim 1, further comprising:
   a second drive circuit which is connected to the first and second block selection signal lines and selects at least one of the first and second block selection signal lines to drive the selected block selection signal line to a High level.

9. A ferroelectric random access memory according to claim 8, wherein the second drive circuit drives both the first and second block selection signal lines to a High level.

10. A ferroelectric random access memory according to claim 1, wherein
   the first to fourth plate lines are provided on the first to fourth memory cell blocks.

* * * * *